(12) United States Patent
Yu et al.

(10) Patent No.: US 11,557,523 B2
(45) Date of Patent: Jan. 17, 2023

(54) SEMICONDUCTOR PACKAGES AND METHODS OF FORMING THE SEMICONDUCTOR PACKAGES

(71) Applicant: SK hynix Inc., Icheon-si Gyeonggi-do (KR)

(72) Inventors: Jae Woong Yu, Guri-si Gyeonggi-do (KR); So Hyun Jung, Seongnam-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 123 days.

(21) Appl. No.: 17/168,767

(22) Filed: Feb. 5, 2021

(65) Prior Publication Data
US 2021/0159137 A1    May 27, 2021

Related U.S. Application Data

(62) Division of application No. 16/230,922, filed on Dec. 21, 2018, now Pat. No. 10,950,512.

(30) Foreign Application Priority Data

Feb. 1, 2018 (KR) .................. 10-2018-0013120
Sep. 19, 2018 (KR) .................. 10-2018-0112409

(51) Int. Cl.
*H01L 23/31* (2006.01)
*H01L 21/768* (2006.01)
(Continued)

(52) U.S. Cl.
CPC .... *H01L 23/3114* (2013.01); *H01L 21/76892* (2013.01); *H01L 23/49816* (2013.01);
(Continued)

(58) Field of Classification Search
CPC .......... H01L 23/3114; H01L 21/76892; H01L 23/49816; H01L 23/49827; H01L 23/49838; H01L 23/5383
(Continued)

(56) References Cited

U.S. PATENT DOCUMENTS 5,994,222 A    11/1999  Smith et al.
8,399,993 B2 *  3/2013  Yun ..................... H01L 23/5389
                                                    257/E27.137
(Continued)

FOREIGN PATENT DOCUMENTS

CN    202435705 U    9/2012
CN    107556740 A    1/2018
(Continued)

*Primary Examiner* — Jami Valentine Miller
(74) *Attorney, Agent, or Firm* — William Park & Associates Ltd.

(57) ABSTRACT

A package substrate of a semiconductor package includes conductive lines of a first layer disposed on a first surface of a base layer and conductive lines of a second layer disposed on a second surface of the base layer. An opening hole located between a first remaining portion and a second remaining portion to separate the first and second remaining portions from each other. The first remaining portion is electrically connected to a first conductive line among the conductive lines of the second layer, and the second remaining portion is electrically connected to a second conductive line among the conductive lines of the second layer.

11 Claims, 14 Drawing Sheets

(51) Int. Cl.
  *H01L 23/538* (2006.01)
  *H01L 23/498* (2006.01)
(52) U.S. Cl.
  CPC .. *H01L 23/49827* (2013.01); *H01L 23/49838* (2013.01); *H01L 23/5383* (2013.01); *H01L 23/3128* (2013.01)
(58) Field of Classification Search
  USPC ......................................... 257/737
  See application file for complete search history.

(56) References Cited

U.S. PATENT DOCUMENTS

| | | | |
|---|---|---|---|
| 9,455,230 B1* | 9/2016 | Park | H01L 23/49827 |
| 9,460,990 B1* | 10/2016 | Sung | H01L 23/562 |
| 2002/0058354 A1 | 5/2002 | Huang et al. | |
| 2003/0106707 A1 | 6/2003 | Vo | |
| 2003/0150110 A1* | 8/2003 | Kang | H05K 3/242 29/830 |
| 2006/0076677 A1 | 4/2006 | Daubenspeck et al. | |
| 2007/0292993 A1 | 12/2007 | Tanoue | |
| 2011/0001239 A1 | 1/2011 | Hsieh | |
| 2012/0199974 A1 | 8/2012 | Lu et al. | |
| 2016/0300787 A1 | 10/2016 | Sung | |
| 2019/0237376 A1* | 8/2019 | Yu | H01L 23/5383 |
| 2019/0237398 A1* | 8/2019 | Yu | H01L 23/49816 |

FOREIGN PATENT DOCUMENTS

| | | |
|---|---|---|
| JP | 2010109425 A | 5/2010 |
| KR | 100891334 B1 | 3/2009 |
| KR | 101296572 B1 | 8/2013 |
| KR | 1020160010246 A | 1/2016 |
| TW | M267628 U | 6/2005 |
| WO | 2011148740 A1 | 12/2011 |

* cited by examiner

SEMICONDUCTOR PACKAGES AND METHODS OF FORMING THE SEMICONDUCTOR PACKAGES

CROSS-REFERENCE TO RELATED APPLICATIONS

The present application is a divisional application of U.S. patent application Ser. No. 16/230,922, filed on Dec. 21, 2018, and claims priority under 35 U.S.C 119(a) to Korean Application Nos. 10-2018-0013120 and 10-2018-0112409, filed on Feb. 1, 2018 and Sep. 19, 2018, respectively, which are herein incorporated by references in their entirety.

BACKGROUND

1. Technical Field

The present disclosure generally relates to semiconductor packages and methods of forming and testing the semiconductor packages.

2. Related Art

Each of semiconductor packages is configured to include a package substrate on which at least one semiconductor chip is mounted. The package substrate includes interconnection lines that are electrically connected to the semiconductor chip. Portions of the interconnection lines may be coated with a plating layer. The plating layer may improve the bondability and the electric conductivity between the interconnection lines and the connectors.

SUMMARY

According to an embodiment, a semiconductor package includes a semiconductor chip and a package substrate on which the semiconductor chip is mounted. The package substrate includes a base layer having a first surface and a second surface which are opposite to each other, a first bonding finger disposed on the first surface of the base layer, a plating lead line disposed on the first surface of the base layer to be spaced apart from the first bonding finger, a first conductive via disposed to substantially penetrate the base layer and electrically connected to the first bonding finger, a second conductive via disposed to substantially penetrate the base layer and electrically connected to the plating lead line, a first ball land and a second ball land disposed on the second surface of the base layer and respectively connected to the first and second conductive vias, a first remaining portion electrically connected to the first conductive via, a second remaining portion electrically connected to the second conductive via, and an opening hole coupled between the first remaining portion and the second remaining portion to space apart the first remaining portion from the second remaining portion. The first ball land may be electrically coupled to the first remaining portion and the second ball land may be electrically coupled to the second remaining portion, and both the first and second ball lands are coupled to substantially the same operation voltages.

According to an embodiment, a semiconductor package includes a semiconductor chip and a package substrate on which the semiconductor chip is mounted. The package substrate includes a base layer having a first surface and a second surface which are opposite to each other, conductive lines of a first layer disposed on the first surface of the base layer, conductive lines of a second layer disposed on the second surface of the base layer and electrically connected to respective ones of the conductive lines of the first layer, a plating lead line electrically connected to a first conductive line of the conductive lines of the first layer, a first remaining portion electrically coupled to a second conductive line among the conductive lines of the second layer, a second remaining portion electrically coupled to a third conductive line among the conductive lines of the second layer, and an opening hole coupled between the first remaining portion and the second remaining portion to space apart the first remaining portion from the second remaining portion. Both the second and third conductive lines may be conductive lines and may be coupled to substantially the same operation voltages.

According to an embodiment, a semiconductor package includes a semiconductor chip and a package substrate on which the semiconductor chip is mounted. The package substrate includes a base layer having a first surface and a second surface which are opposite to each other, a first group of conductive lines and a second group of conductive lines disposed on the first surface of the base layer, a third group of conductive lines disposed on the second surface of the base layer and electrically connected to respective ones of the first group of conductive lines, a fourth group of conductive lines disposed on the second surface of the base layer and electrically connected to respective ones of the second group of conductive lines, a first plating lead line connected to a first conductive line among the first group of conductive lines, a second plating lead line connected to a second conductive line among the second group of conductive lines, a first opening hole coupled between a first remaining portion and a second remaining portion to space apart the first remaining portion from the second remaining portion and electrically disconnect the third group of conductive lines from each other, and a second opening hole coupled between a third remaining portion and a fourth remaining portion to space apart the third remaining portion from the fourth remaining portion and electrically disconnect the fourth group of conductive lines from each other. Both the first and second remaining portions are conductive lines and are coupled to first operation voltages. Both the third and fourth remaining portions are another conductive lines and are coupled to second operation voltages different from the first voltages.

According to an embodiment, a method of forming a semiconductor package includes forming a package substrate having a base layer in which a first surface and a second surface are opposite to each other, mounting a semiconductor chip on the package substrate, disposing a first bonding finger on the first surface of the base layer, disposing a plating lead line on the first surface of the base layer to be spaced apart from the first bonding finger, disposing a first conductive via substantially penetrating the base layer to electrically connect with the first bonding finger, disposing a second conductive via substantially penetrating the base layer to electrically connect with the plating lead line, disposing a first ball land and a second ball land on the second surface of the base layer and respectively connecting the first and second ball lands with the first and second conductive vias, disposing a first provision bridge line on the second surface of the base layer to electrically connect the first conductive via to the second conductive via, and forming an opening hole penetrating a dielectric layer on the first provisional bride line and cutting the first provisional bridge line to provide a first remaining portion and a second remaining portion that are spaced apart from each other. The first ball land may be electrically coupled to the first remaining portion and the second ball land is electrically coupled to the second remaining portion.

According to an embodiment, a method of forming a semiconductor package includes forming a package substrate having a base layer in which a first surface and a second surface are opposite to each other, mounting a semiconductor chip on the package substrate, disposing conductive lines of a first layer on the first surface of the base layer, disposing conductive lines of a second layer on the second surface of the base layer which are electrically connected to respective ones of the conductive lines of the first layer, electrically connecting a plating lead line to a first conductive line of the conductive lines of the first layer, electrically connecting the conductive lines of the second layer to each other with a provisional bridge line, and forming an opening hole penetrating a dielectric layer on the provisional bridge line and cutting the provisional bridge line to provide a first remaining portion and a second remaining portion that are spaced apart from each other. A second conductive line among the conductive lines of the second layer may be electrically coupled to the first remaining portion, and a third conductive line among the conductive lines of the second layer may be electrically coupled to the second remaining portion.

According to an embodiment, a method of forming a semiconductor package includes forming a package substrate having a base layer in which a first surface and a second surface are opposite to each other, mounting a semiconductor chip on the package substrate, disposing a first group of conductive lines and a second group of conductive lines on the first surface of the base layer, disposing a third group of conductive lines on the second surface of the base layer and electrically connecting the third group of conductive lines to respective ones of the first group of conductive lines, disposing a fourth group of conductive lines on the second surface of the base layer and electrically connecting the fourth group of conductive lines to respective ones of the second group of conductive lines, connecting a first plating lead line to a first conductive line among the first group of conductive lines, connecting a second plating lead line connected to a second conductive line among the second group of conductive lines, disposing a first group of provisional bridge lines to electrically connect the third group of conductive lines to each other, disposing a second group of provisional bridge lines to electrically connect the fourth group of conductive lines to each other, forming a first opening hole penetrating a dielectric layer on the first group of provisional bridge lines and cutting one of the first group of provisional bridge lines to provide a first remaining portion and a second remaining portion that are spaced apart from each other, and forming a second opening hole penetrating the dielectric layer and cutting another one of the first group of provisional bridge lines to provide a third remaining portion and a fourth remaining portion that are spaced apart from each other.

DETAILED DESCRIPTION

Figure 1:
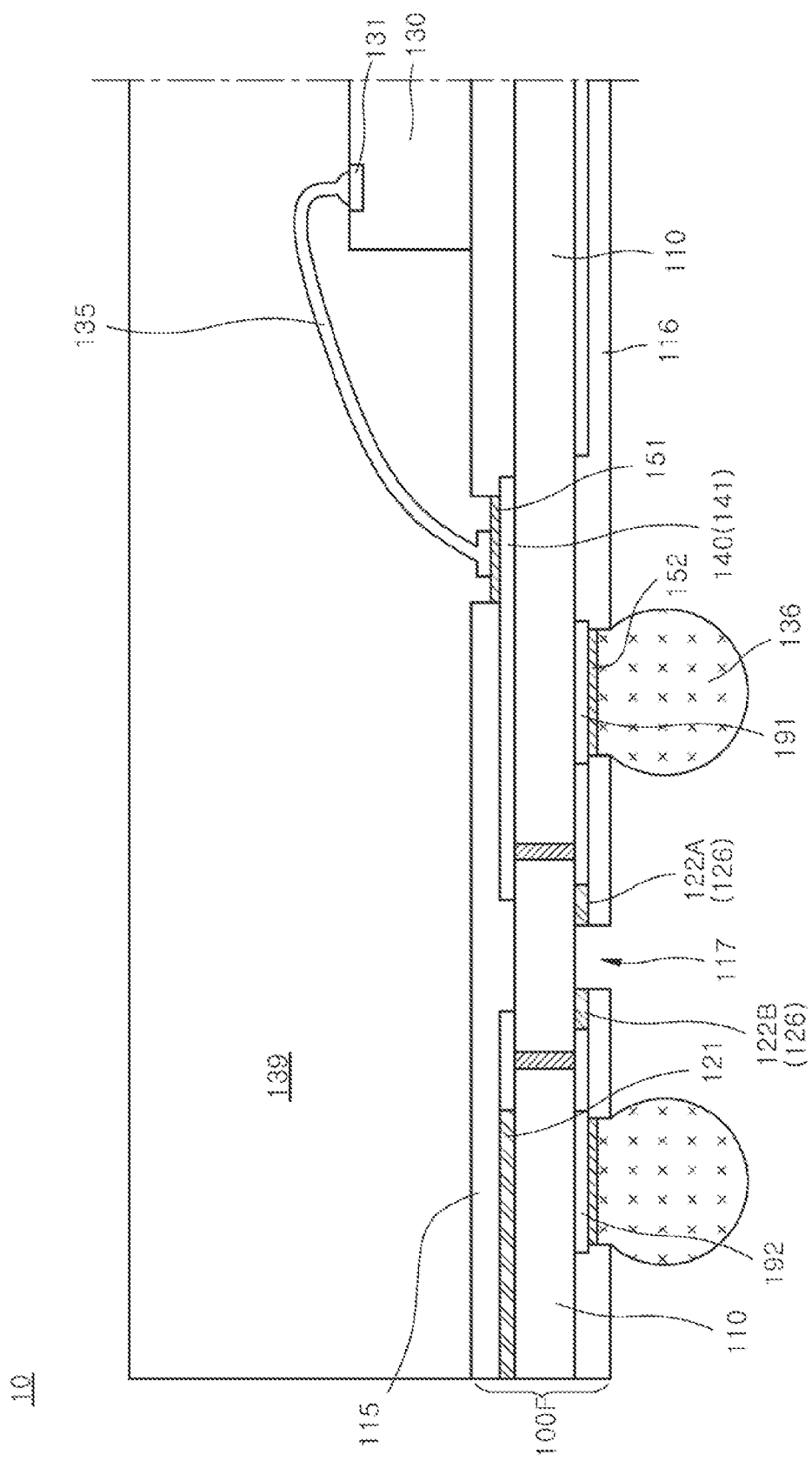
FIG. 1 is a cross-sectional view illustrating a semiconductor package according to an embodiment of the present disclosure.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

In a semiconductor package, a semiconductor chip may be mounted on a package substrate. The package substrate may be configured to include interconnection lines that are electrically connected to the semiconductor chip. Portions of the interconnection lines may be coated with a plating layer being in contact with connectors of the semiconductor package. The plating layer may improve the bondability between the interconnection lines and the connectors as well as the electric conductivity of the interconnection lines.

The plating layer may be formed using an electrolytic plating process. The interconnection lines may be connected to plating lines in order to form the plating layer using an electrolytic plating process. The plating lines may be long conductive patterns that extend from an edge of the package substrate to be connected to the interconnection lines (acting as signal lines). The plating lines may be conductive lines that are necessary to the electrolytic plating process. However, the plating lines do not function as the interconnection lines which are used as signal lines while the semiconductor package operates.

While the semiconductor package operates, the plating lines may act as undesirable transmission lines such as stubs. If the plating lines are connected to the signal lines, the plating lines may function as detour paths of signals or reflection paths of signals. Since the plating lines undesirably reflect the signals, the plating lines may degrade a transmission speed of the signals, operation characteristics of the semiconductor package, or a signal integrity of the semiconductor package. The present disclosure provides semiconductor packages, each of which includes a package substrate with plating lines having a reduced total length.

Variation of external environment such as humidity or temperature may cause electro-chemical migration (ECM) failure of a package substrate. The present disclosure provides semiconductor packages, each of which employs a package substrate that is capable of suppressing or preventing the ECM failure.

Figure 2:
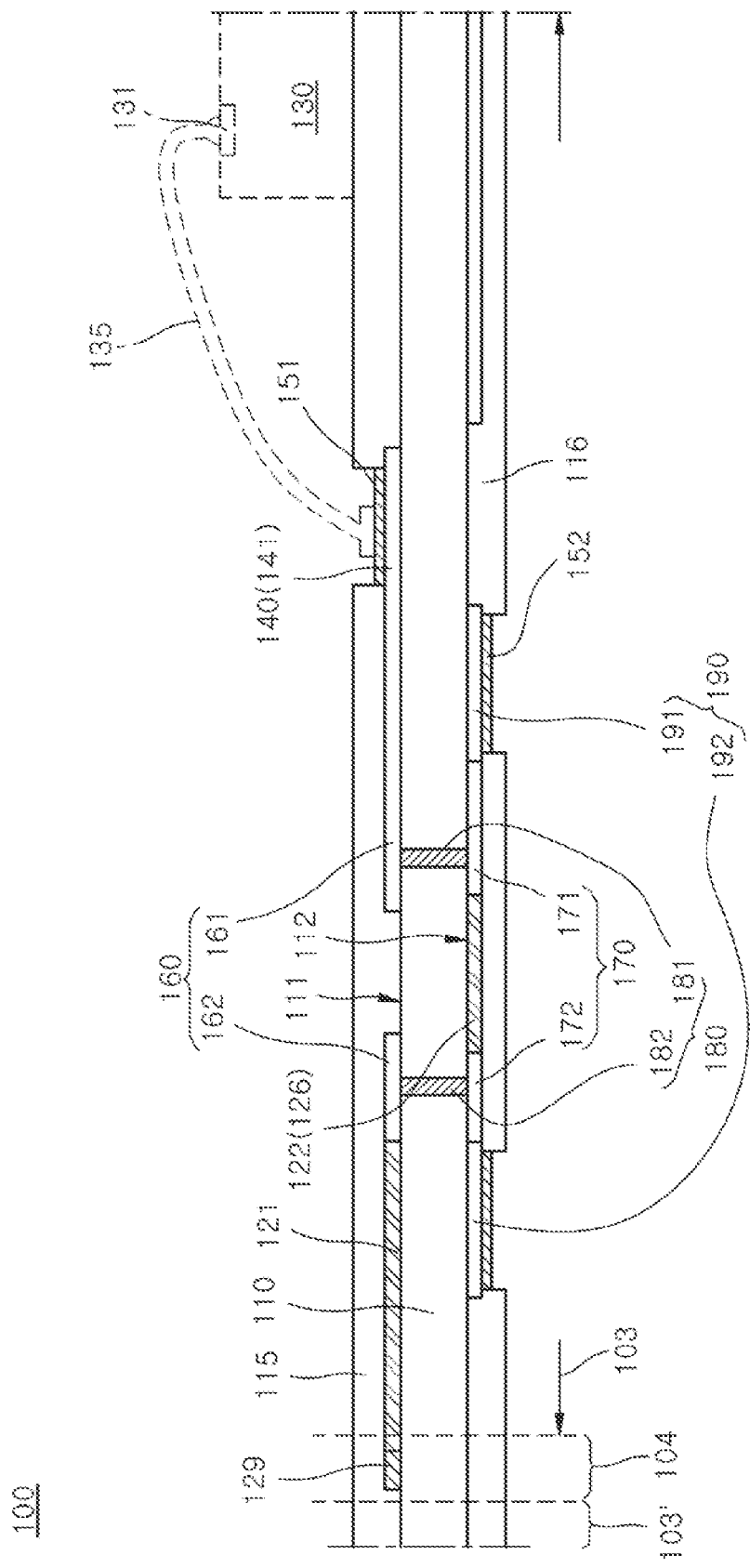
FIG. 2 is a cross-sectional view schematically illustrating a package substrate before formation of opening holes in an embodiment of the present disclosure.
Figure 3:
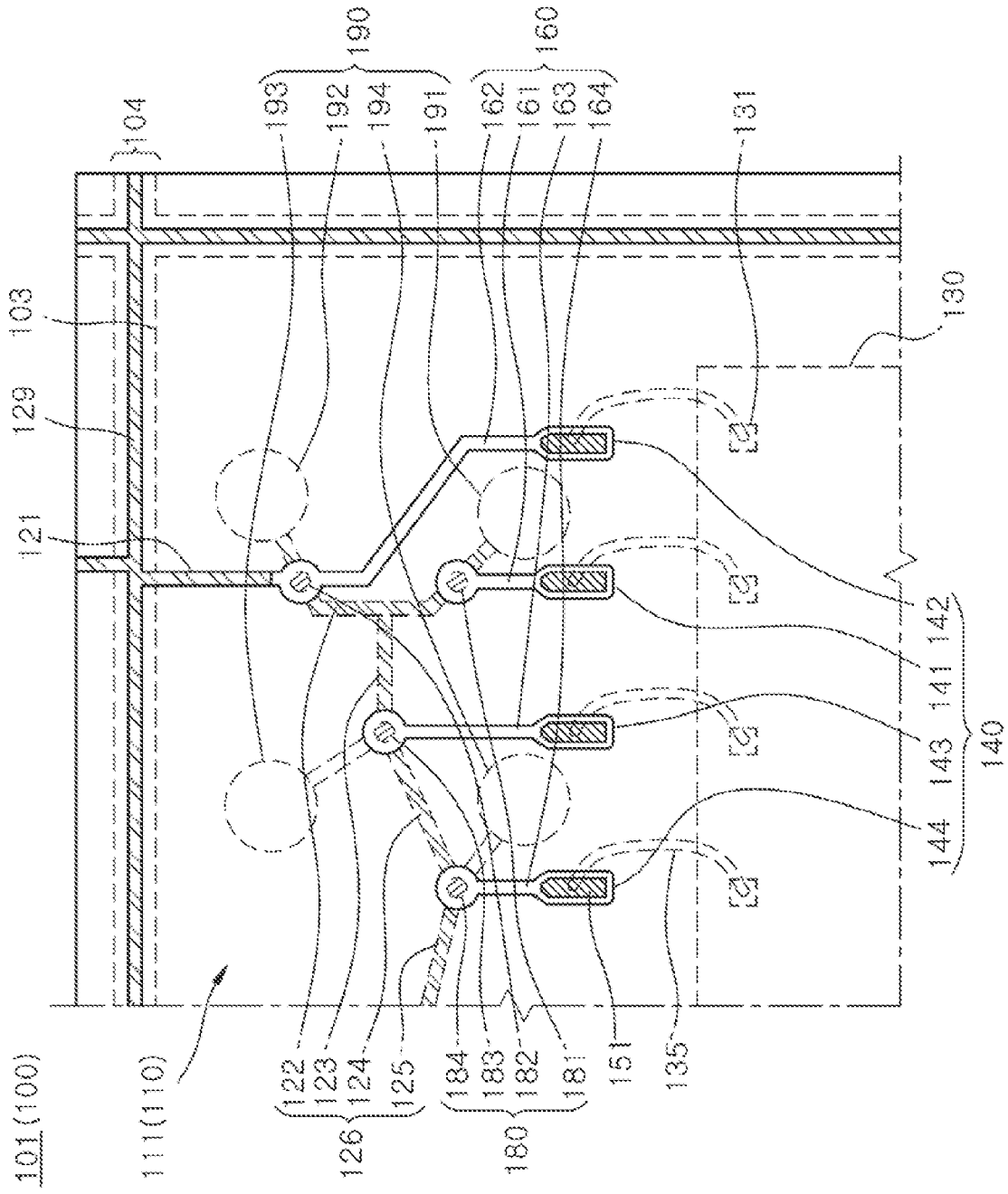
FIG. 3 is a plan view schematically illustrating a top circuit layout of the package substrate illustrated in FIG. 2.
Figure 4:
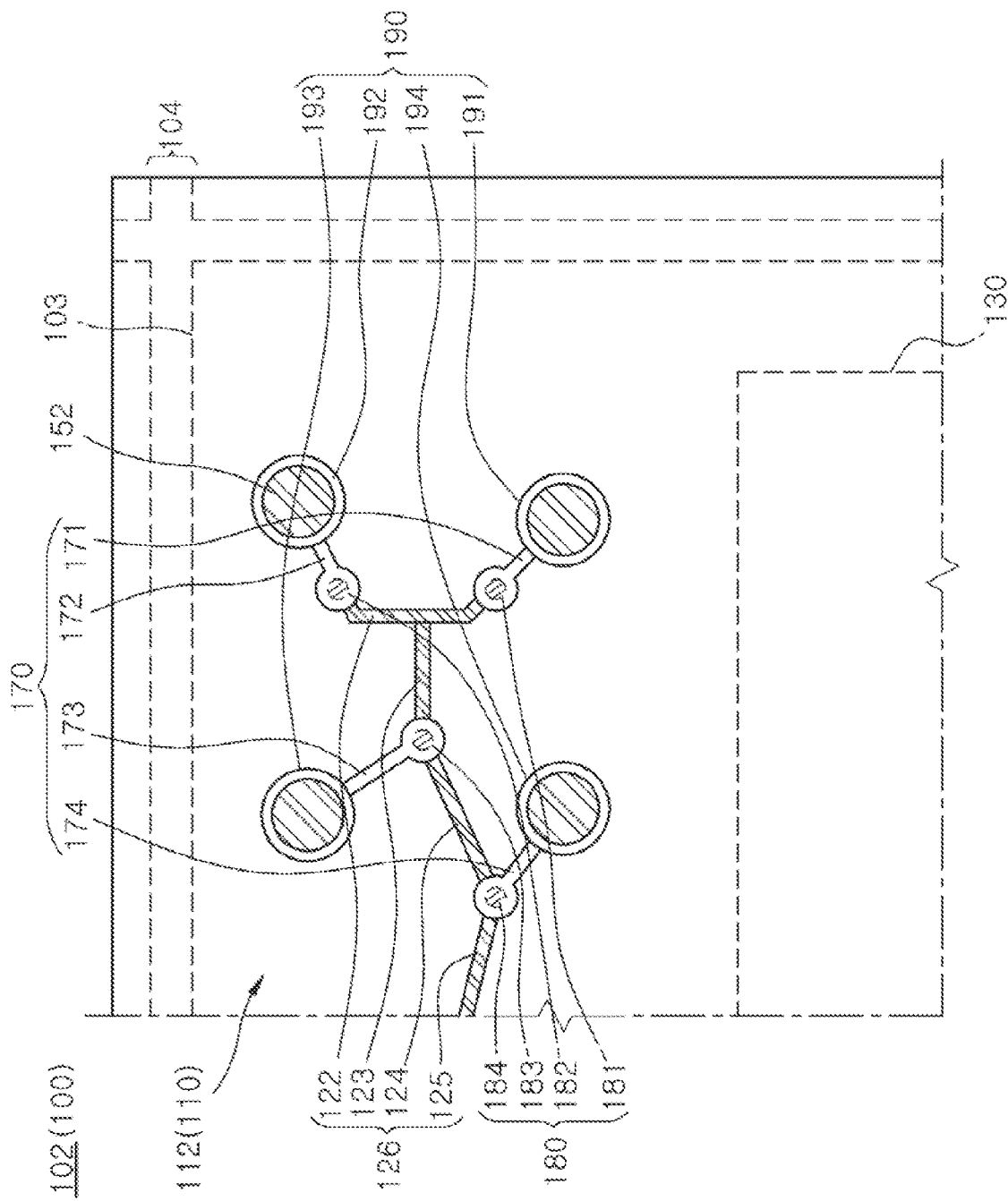
FIG. 4 is a plan view schematically illustrating a bottom circuit layout of the package substrate illustrated in FIG. 2.

FIG. 1 is a cross-sectional view schematically illustrating a semiconductor package 10 according to an embodiment of the present disclosure. FIG. 2 is a cross-sectional view schematically illustrating a package substrate 100 included in a semiconductor package according to an embodiment. The package substrate 100 of FIG. 2 corresponds to a package substrate 100F illustrated in FIG. 1 before opening holes 117 of the package substrate 100F are formed. FIG. 3 is a plan view schematically illustrating a top circuit layout 101 of the package substrate 100 illustrated in FIG. 2. FIG. 4 is a plan view schematically illustrating a bottom circuit layout 102 of the package substrate 100 shown in FIG. 2.

Referring to FIG. 1, the semiconductor package 10 may include a semiconductor chip 130 mounted on the package substrate 100F. The package substrate 100F may include a plating lead line 121, a first remaining portion 122A of a provisional bridge line 126 for plating, and a second remaining portion 122B of the provisional bridge line 126 for plating. The opening hole 117 may cut the provisional bridge line 126 into two portions of the first and second remaining portions 122A and 122B that faces each other. That is, the first and second remaining portions 122A and 122B of the provisional bridge line 126 for plating may be separated from each other by the opening hole 117. The first and second remaining portions 122A and 122B of the provisional bridge line 126 may be respectively connected to interconnection lines to which the same operation voltage is applied.

The semiconductor chip 130 may be mounted on a first dielectric layer 115 of the package substrate 100F. A molding layer 139 may be disposed on the first dielectric layer 115 of the package substrate 100F to cover the semiconductor chip 130. Bonding wires 135 may be disposed to electrically connect contact pads 131 of the semiconductor chip 130 to bonding fingers 140 of the package substrate 100F. The bonding wires 135 may be connected to the bonding fingers 140 through a first plating layer 151. The package substrate 100F may also include a second plating layer 152, and solder balls 136 acting as outer connectors may be attached to the second plating layer 152.

Referring to FIG. 2, the package substrate 100 may correspond to a pre-package substrate having a status before the opening holes 117 illustrated in FIG. 1 are formed. The package substrate 100 may include a base layer 110 and plating lines disposed on the base layer 110. The base layer 110 may be a dielectric layer acting as a body or a core of the package substrate 100. The plating lines may include the plating lead line 121 and the provisional bridge line 126 for plating. The provisional bridge line 126 may include a first provisional bridge line 122. As illustrated in FIG. 3, the provisional bridge line 126 may further include second to fourth provisional bridge lines 123, 124 and 125.

The base layer 110 may have a first surface 111 and a second surface 112 which are opposite to each other. The first dielectric layer 115 may be disposed on the first surface 111 of the base layer 110, and a second dielectric layer 116 may be disposed on the second surface 112 of the base layer 110. Each of the first and second dielectric layers 115 and 116 may be formed of a material layer including a solder resist layer. The package substrate 100 may be a printed circuit board (PCB). The package substrate 100 may have a ball grid array (BGA) structure.

The package substrate 100 may include a boundary region 104 and an inner region 103 which is surrounded by the boundary region 104 in a plan view. The package substrate 100 may also include another inner region 103' next to the inner region 103, and the other inner region 103' may be connected to the inner region 103 through the boundary region 104.

The semiconductor chip 130 may be mounted on the inner region 103 of the package substrate 100. The interconnection lines electrically connected to the semiconductor chip 130 may be disposed in the inner region 103. The semiconductor chip 130 may be mounted on the first surface 111 the base layer 110. The semiconductor chip 130 may be attached to the first dielectric layer 115. The boundary region 104 may be removed in a final step of a package process for encapsulating the semiconductor chip 130. The boundary region 104 may be removed by a sawing process for separating discrete semiconductor packages from each other after a plurality of semiconductor chips (including the semiconductor chip 130) mounted on the package substrate 100 are molded by the molding layer (139 of FIG. 1).

Referring to FIG. 3, the top circuit layout 101 may include top interconnection lines disposed on the first surface 111 of the base layer 110. As illustrated in the top circuit layout 101 of FIG. 3, the top interconnection lines may include the bonding fingers 140, trace patterns 160 of a first layer, and the plating lead line 121.

The bonding fingers 140 may be disposed on the first surface 111 of the base layer 110 to be spaced apart from each other. For example, the bonding fingers 140 may include first to fourth bonding fingers 141, 142, 143 and 144 which are disposed on the first surface 111 of the base layer 110 to be spaced apart from each other. The bonding fingers 140 may be disposed in the periphery of the semiconductor chip 130 to be electrically connected to the semiconductor chip 130.

The first bonding finger 141, the third bonding finger 143 and the fourth bonding finger 144 among the bonding fingers 140 may be used as portions of signal lines that transmit signals to the semiconductor chip 130. The signals transmitted by the first bonding finger 141, the third bonding finger 143 and the fourth bonding finger 144 may include data signals, address signals and command signals. Accordingly, the signals may be transmitted to or outputted from the semiconductor chip 130 through the first bonding finger 141, the third bonding finger 143 and the fourth bonding finger 144. Meanwhile, the second bonding finger 142 may be a portion of any one of non-signal lines. The non-signal lines may include a power line and a ground line. Thus, a power voltage or a ground voltage may be applied to the semiconductor chip 130 through the second bonding finger 142.

The trace patterns 160 of the first layer may be conductive lines extending from the bonding fingers 140. The trace patterns 160 of the first layer may electrically connect the bonding fingers 140 to conductive vias 180. The trace patterns 160 of the first layer may include first to fourth trace patterns 161, 162, 163 and 164.

Referring to FIGS. 2 and 4, the bottom circuit layout 102 may include bottom interconnection lines disposed on the second surface 112 of the base layer 110. As illustrated in the bottom circuit layout 102 of FIG. 4, the bottom interconnection lines may include ball lands 190, trace patterns 170 of a second layer, and the provisional bridge lines 126 for plating. The trace patterns 170 of the second layer may be disposed on the second surface 112 of the base layer 110.

The conductive vias 180 may electrically connect the trace patterns 160 of the first layer to the trace patterns 170 of the second layer. First ends of the conductive vias 180 may be respectively connected to the trace patterns 160 of the first layer, and second ends of the conductive vias 180 may be respectively connected to the trace patterns 170 of the second layer. The conductive vias 180 may be conductive patterns vertically penetrating the base layer 110. The trace patterns 170 of the second layer may include fifth to eighth trace patterns 171, 172, 173 and 174. The terms "first" to "eighth" used in the trace patterns 160 and 170 should not be limited by these terms. These terms "first" to "eighth" are only used to distinguish one element from another element, but not used to define only the element itself or to mean a particular sequence.

The ball lands 190 may be electrically connected to the trace patterns 170 of the second layer, respectively. The trace patterns 170 of the second layer may electrically connect the conductive vias 180 to the ball lands 190. Outer connectors (not shown) may be attached to the ball lands 190 to electrically connect the package substrate 100 to an external device or an external system. The outer connectors may include solder balls.

Referring to FIGS. 2 and 3, the bonding fingers 140 may be connected to the semiconductor chip 130 through inner connectors. For example, the first bonding finger 141 may be electrically connected to one of the contact pads 131 of the semiconductor chip 130 through one of the bonding wires 135. Although FIG. 3 illustrates an example in which the bonding wires 135 are used as the inner connectors, the inner connectors may be conductive members other than the bonding wires 135. For example, in some other embodiments, the inner connectors may be conductive bumps.

The first plating layer 151 may be formed on a portion of each of the bonding fingers 140. The first plating layer 151 may improve the bondability between the bonding wires 135 and the bonding fingers 140. In addition, the first plating layer 151 may improve a contact resistance value between the bonding wires 135 and the bonding fingers 140. If the bonding fingers 140 are formed of a copper layer, the first plating layer 151 may be formed of a material layer which is capable of preventing the copper layer from corrosion and contamination. The first plating layer 151 may be formed using an electrolytic plating process. The first plating layer 151 may be formed to include a conductive material different from the bonding fingers 140. For example, the first plating layer 151 may be formed to include a nickel layer and a gold layer.

Referring to FIGS. 2 and 4, the second plating layer 152 may be formed on each of the ball lands 190. The second plating layer 152 may be formed of a material layer which is capable of preventing the ball lands 190 from being oxidized. The second plating layer 152 may be formed of a material layer which is capable of suppressing excessive formation of an intermetallic compound material when the outer connectors (e.g., solder balls) are attached to the ball lands 190. The first and second plating layers 151 and 152 may be simultaneously formed using a single electrolytic plating process. Alternatively, the first and second plating layers 151 and 152 may be independently formed using two separate electrolytic plating processes.

Referring again to FIG. 2, the electrolytic plating process for forming the first and second plating layers 151 and 152 may require that a plating electric current is applied on the bonding fingers 140 and the ball lands 190. In such a case, the plating electric current may be applied on the bonding fingers 140 and the ball lands 190 through a plating line structure including the plating lead line 121, the provisional bridge lines 126 for plating, and a plating bus 129.

Referring to FIG. 3, the plating bus 129 may be disposed in the boundary region 104 of the package substrate 100. The plating bus 129 may be formed on the first surface 111 of the base layer 110 in the boundary region 104 of the package substrate 100. The plating lead line 121 may be conductive lines which are branched from the plating bus 129. The plating lead line 121 may extend from the plating bus 129 and may be electrically connected to the second bonding finger 142. For example, the plating lead line 121 may be coupled to the second trace pattern 162 and may be electrically connected to the second bonding finger 142 through the second trace pattern 162. Although not shown in the drawings, in some other embodiments, the plating lead line 121 may be directly connected to the second bonding finger 142 without any intervening elements therebetween.

The plating lead line 121 may be disposed on the first surface 111 of the base layer 110 and may be connected only to the second bonding finger 142 among the bonding fingers 140 disposed on the first surface 111 of the base layer 110. The plating lead line 121 may be connected to the second bonding finger 142 through the second trace pattern 162. The plating lead line 121 may be disposed on the first surface 111 of the base layer 110 to be spaced apart from the first bonding finger 141. The plating lead line 121 may not be directly connected to the first, third and fourth trace patterns 161, 163 and 164 on the first surface 111 of the base layer 110. The plating lead line 121 may not be directly connected to the first, third and fourth bonding fingers 141, 143 and 144 on the first surface 111 of the base layer 110.

The second bonding finger 142 and the second trace pattern 162 may constitute a portion of any one of non-signal lines such as a power line and a ground line. In contrast, the first bonding finger 141 and the first trace pattern 161 may constitute a portion of any one of signal lines, the third bonding finger 143 and the third trace pattern 163 may constitute a portion of another one of the signal lines, and the fourth bonding finger 144 and the fourth trace pattern 164 may constitute a portion of yet another one of the signal lines. The plating lead line 121 may be connected only to the non-signal lines disposed on the first surface 111 of the base layer 110 and may not be directly connected to the signal lines disposed on the first surface 111 of the base layer 110.

Referring to FIG. 2, while the plating lead line 121 and the plating bus 129 are disposed on the first surface 111 of the base layer 110, the provisional bridge lines 126 for plating may be disposed on the second surface 112 of the base layer 110. That is, the plating lead line 121 may be disposed on a surface of the base layer 110 opposite to the provisional bridge lines 126 for plating, and the provisional bridge lines 126 for plating may be disposed on a surface of the base layer 110 opposite to the plating lead line 121.

Referring to FIG. 4, the provisional bridge lines 126 for plating may electrically connect the conductive vias 180, which are spaced apart from each other, to each other. Accordingly, a plating electric current between the conductive vias 180 may flow through the provisional bridge lines 126 for plating during the electrolytic plating process, and the provisional bridge lines 126 for plating may be cut away after the electrolytic plating. The plating electric current applied on the plating lead line 121 may flow through the provisional bridge lines 126 for plating and the conductive vias 180 to reach the first, third and fourth bonding fingers 141, 143 and 144.

Referring to FIGS. 2 and 4, the fifth trace pattern 171 electrically connected to a first ball land 191 of the ball lands 190 may be disposed on the second surface 112 of the base layer 110. The first ball land 191 may be electrically connected to a first conductive via 181 of the conductive vias 180. The fifth trace pattern 171 may be connected to the first conductive via 181 and may be electrically connected to the first trace pattern 161 through the first conductive via 181. The first ball land 191 may be electrically connected to the first bonding finger 141 through the fifth trace pattern 171, the first conductive via 181 and the first trace pattern 161. The first ball land 191, the fifth trace pattern 171, the first conductive via 181, the first trace pattern 161 and the first bonding finger 141 may provide one of the signal lines.

A second ball land 192 of the ball lands 190 may be disposed to be spaced apart from the first ball land 191. The second ball land 192 may be electrically connected to the second conductive via 182. The first provisional bridge line 122 of the provisional bridge lines 126 may electrically connect the first ball land 191 to the second ball land 192. The first provisional bridge line 122 may electrically connect the fifth trace pattern 171 to the sixth trace pattern 172. The fifth trace pattern 171 may electrically connect the first ball land 191 to the first conductive via 181. The sixth trace pattern 172 may electrically connect the second ball land 192 to the second conductive via 182. The first ball land 191 may be electrically connected to the second ball land 192 through the first provisional bridge line 122, the fifth trace pattern 171 and the sixth trace pattern 172. The first provisional bridge line 122 may electrically connect the first conductive via 181 to the second conductive via 182. The second ball land 192, the sixth trace pattern 172, the second conductive via 182, the second trace pattern 162 and the second bonding finger 142 may provide a power line or a ground line.

The fifth and sixth trace patterns 171 and 172 may be conductive patterns that are disposed on the second surface 112 of the base layer 110 to be spaced apart from each other. The second conductive via 182 may be disposed to be spaced apart from the first conductive via 181. The second conductive via 182 may be electrically connected to the plating lead line 121 on the first surface 111 of the base layer 110. The first conductive via 181 may be electrically connected to the first bonding finger 141 on the first surface 111 of the base layer 110.

The first provisional bridge line 122 may connect the first conductive via 181 to the second conductive via 182. The first provisional bridge line 122 may electrically connect the first bonding finger 141 and the first ball land 191 to the plating lead line 121. The plating electric current applied through the plating lead line 121 may flow through the first provisional bridge line 122 to reach the first bonding finger 141 and the first ball land 191.

The plating electric current applied through the plating bus 129 may flow through the plating lead line 121, the second trace pattern 162, the second conductive via 182, the sixth trace pattern 172, the first provisional bridge line 122, the fifth trace pattern 171, the first conductive via 181 and the first trace pattern 161 to reach the first bonding finger 141. Since the plating electric current is applied on the first bonding finger 141, the first plating layer 151 may be formed on the first bonding finger 141 by an electrolytic plating technique.

The plating electric current applied on the plating bus 129 may flow through the plating lead line 121, the second trace pattern 162, the second conductive via 182, the sixth trace pattern 172, the first provisional bridge line 122 and the fifth trace pattern 171 to reach the first ball land 191. When the plating electric current is simultaneously applied on the first bonding finger 141 and the first ball land 191, the first plating layer 151 and the second plating layer 152 may be simultaneously formed on the first bonding finger 141 and the first ball land 191 by the electrolytic plating technique, respectively.

The plating electric current applied on the plating bus 129 may flow through the plating lead line 121, the second trace pattern 162, the second conductive via 182 and the sixth trace pattern 172 to reach the second ball land 192. Because the second trace pattern 162 is connected to the second bonding finger 142 (see FIG. 3), the plating electric current applied through the plating bus 129 may also reach the second bonding finger 142. Thus, the first plating layer 151 and the second plating layer 152 may be simultaneously formed on the second bonding finger 142 and the second ball land 192 by the electrolytic plating technique, respectively.

Referring to FIGS. 3 and 4, the second provisional bridge line 123 of the provisional bridge lines 126 and the first provisional bridge line 122 of the provisional bridge lines 126 may electrically connect the plating lead line 121 to the third bonding finger 143 and a third ball land 193 of the ball lands 190. The second provisional bridge line 123 may electrically connect the first provisional bridge line 122 to the third conductive via 183 and the seventh trace pattern 173 connected to the third conductive via 183. Although FIG. 4 illustrates an example in which the second provisional bridge line 123 is directly connected to the first provisional bridge line 122, the second provisional bridge line 123 may be directly connected to the first and second ball lands 191 and 192 or the fifth and sixth trace patterns 171 and 172 in some other embodiments.

The third provisional bridge line 124 of the provisional bridge lines 126 and the first and second provisional bridge lines 122 and 123 may electrically connect the plating lead line 121 to the fourth bonding finger 144 and a fourth ball land 194 of the ball lands 190. The third provisional bridge line 124 may be electrically connected to the first provisional bridge line 122 through the second provisional bridge line 123. A fourth conductive via 184 of the conductive vias 180 may be electrically connected to the first provisional bridge line 122 through the second and third provisional bridge lines 123 and 124. The second provisional bridge line 123 may be electrically connected to the eighth trace pattern 174 and the fourth conductive via 184 through the third provisional bridge line 124.

The fourth provisional bridge line 125 of the provisional bridge lines may extend to electrically connect the plating lead line 121 to an additional bonding finger (not shown) of the bonding fingers 140 and an additional ball land (not shown) of the ball lands 190. That is, the plating lead line 121 may be electrically connected to the additional bonding finger and the additional ball land through the first to fourth provisional bridge lines 122, 123, 124 and 125.

As described above, the provisional bridge lines 126 may be provided to electrically connect the ball lands 190 to each other. The first, third and fourth bonding fingers 141, 143 and 144 may not be directly connected to the plating lead line 121 on the first surface 111 of the base layer 110. However, the first, third and fourth bonding fingers 141, 143 and 144 may be electrically connected to the plating lead line 121 through the provisional bridge lines 126 and the conductive vias 180.

Additional plating lead lines other than the plating lead line 121 may not be required on the first surface 111 of the base layer 110 because of the presence of the provisional bridge lines 126. That is, according to an embodiment, the additional plating lead lines for directly connecting the first, third and fourth bonding fingers 141, 143 and 144 to the plating bus 129 may not be required.

When the plating electric current is applied through the plating bus 129, the plating lead line 121 and the provisional bridge lines 126, the first and second plating layers 151 and 152 may be formed by an electrolytic plating technique. After the first and second plating layers 151 and 152 are formed, the provisional bridge lines 126 may be cut away. That is, each of the provisional bridge lines 126 may be cut to have an electrical open state.

Figure 5:
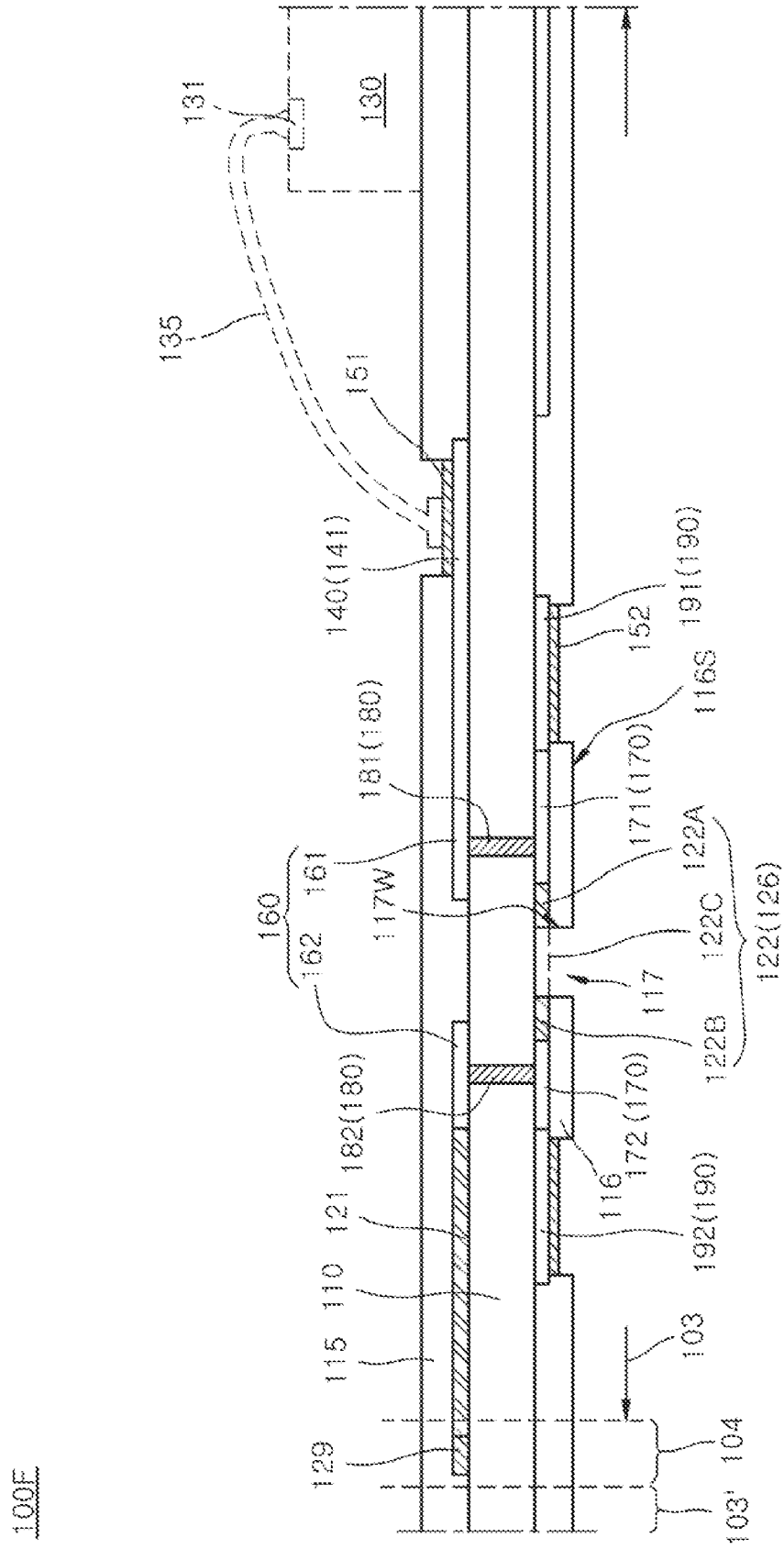
FIG. 5 is a cross-sectional view schematically illustrating a package substrate including opening holes in an embodiment of the present disclosure.
Figure 6:
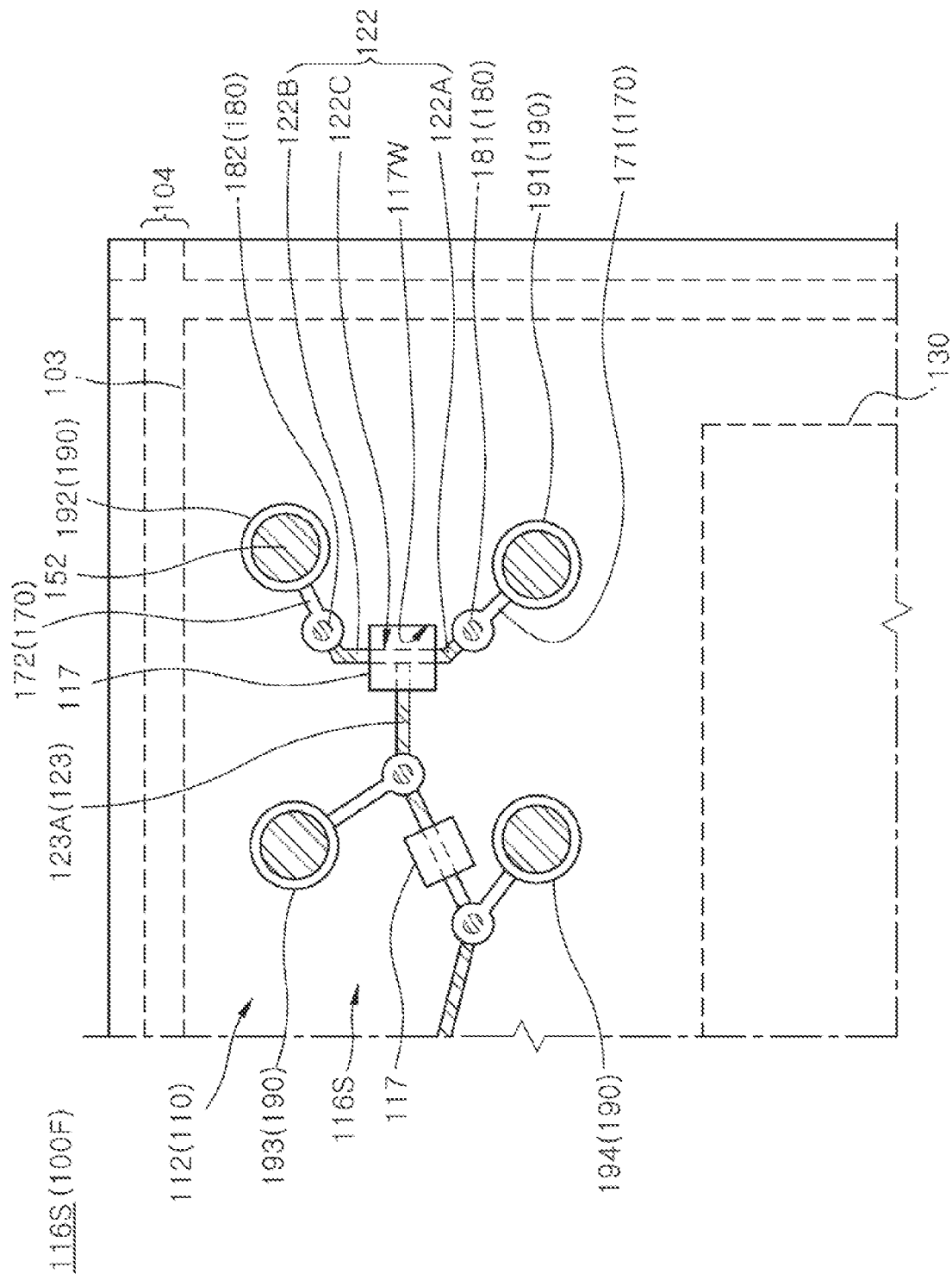
FIGS. 6 to 9 are plan views schematically illustrating package substrates including opening holes in some embodiments of the present disclosure.
Figure 7:
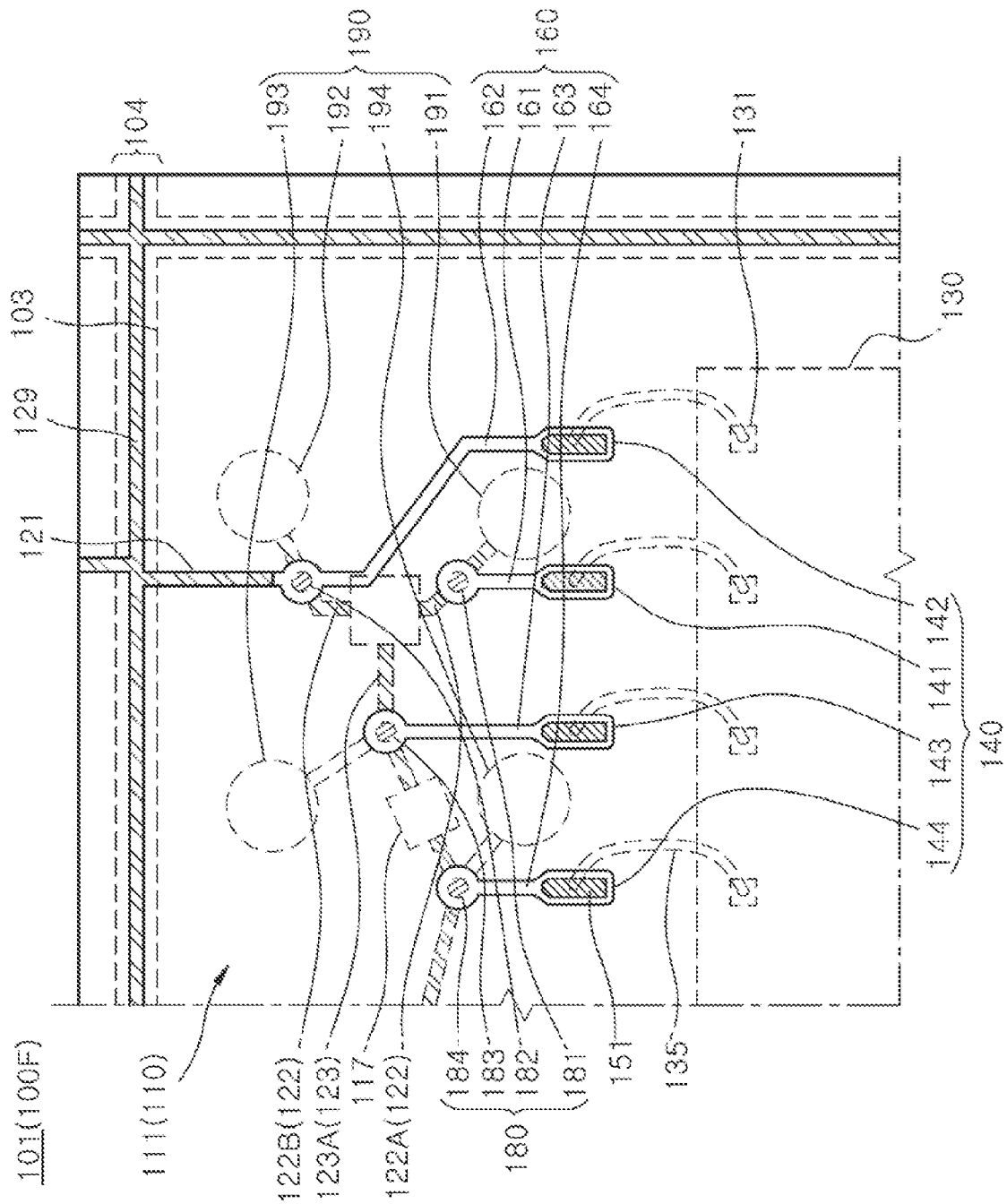

FIG. 5 is a cross-sectional view schematically illustrating the package substrate 100F including the opening holes 117 in an embodiment of the present disclosure. FIG. 6 is a plan view schematically illustrating a bottom surface 116S of the package substrate 100F including the opening holes 117 in an embodiment of the present disclosure. FIG. 7 is a plan view illustrating the top circuit layout 101 of the package substrate 100F illustrated in FIG. 5.

Referring to FIGS. 5 to 7, after the first and second plating layers 151 and 152 are formed, central portions of the provisional bridge lines 126 may be removed to form the opening holes 117. For example, the central portion 122C of the first provisional bridge line 122 may be removed to form one of the opening holes 117. The opening holes 117 may be formed at the bottom surface 116S of the package substrate 100F. The bottom surface 116S of the package substrate 100F may be provided by a surface of the second dielectric layer 116. The opening holes 117 may be formed to penetrate the second dielectric layer 116. The opening holes 117 may be formed using an etch process which is applied to portions of the second dielectric layer 116. One of the opening holes 117 may be formed by removing portions of the second dielectric layer 116 to expose the central portion 122C of the first provisional bridge line 122 and by removing the exposed central portion 122C of the first provisional bridge line 122.

Side surfaces of remaining portions of the provisional bridge lines 126 may be exposed along sidewalls 117W of the opening holes 117. For example, side surfaces of the first remaining portion 122A and the second remaining portion 122B of the first provisional bridge line 122 may be exposed along sidewalls 117W of one of the opening holes 117. The first remaining portion 122A and the second remaining portion 122B may be separated by the opening hole 117. When the central portion 122C corresponding to a joint of the first and second provisional bridge lines 122 and 123 is removed to form the opening hole 117, the side surfaces of the first and second remaining portions 122A and 122B of the first provisional bridge line 122 and a side surface of a remaining portion 123A of the second provisional bridge line 123 may be exposed and defined by the sidewalls 117W of the opening hole 117.

The opening hole 117 may be provided in the second dielectric layer 116. The central portion 122C of the first provisional bridge line 122 may be removed to provide the opening hole 117. The first and second remaining portions 122A and 122B are separated from each other by the opening hole 117. Since the first and second remaining portions 122A and 122B of the first provisional bridge line 122 are physically spaced apart from each other, the first provisional bridge line 122 may have an electrical open state. The joint of the first and second provisional bridge lines 122 and 123 may be removed to provide the opening hole 117. The remaining portions 122A, 122B and 123A are separated from each other by the opening hole 117.

The ball lands 190 of the FIG. 4 may be electrically connected to each other by the provisional bridge lines 126. In FIGS. to 7, since the provisional bridge lines 126 are cut while forming the opening holes 117, the ball lands 190 may be electrically isolated from each other. For example, the first ball land 191 may be electrically disconnected from the second to fourth ball lands 192, 193 and 194 by the opening holes 117.

Referring to FIGS. 4 and 6, the first ball land 191 may be connected to the first remaining portion 122A of the first provisional bridge line 122 through the fifth trace pattern 171. In addition, the second ball land 192 may be connected to the second remaining portion 122B of the first provisional bridge line 122 through the sixth trace pattern 172.

Referring to FIGS. 1, 4 and 6, the first and second ball lands 191 and 192 may correspond to ball lands to which operation voltages for operating the semiconductor chip 130 of the semiconductor package 10 are applied. The operation voltages applied to the first and second ball lands 191 and 192 may have the same voltage level. For example, when the semiconductor chip 130 operates, a voltage signal having 1.17 volts may be applied to the first ball land 191 and may be transmitted to the first bonding finger 141. Accordingly, an electrical path between the first ball land 191 and the first bonding finger 141 may correspond to a signal line through which the voltage signal having 1.17 volts is transmitted. In addition, a power voltage having 1.17 volts may be applied to the second ball land 192. In such a case, an electrical path between the second ball land 192 and the second bonding finger 142 correspond to a power line through which the power voltage having 1.17 volts is transmitted. As a result, the power voltage having the same voltage level as the voltage signal applied to the first ball land 191 may be applied to the second ball land 192. That is, the same operation voltage may be applied to both of the first and second ball lands 191 and 192. The first and second ball lands 191 and 192 to which the same operation voltage is applied may be electrically connected to each other by the first provisional bridge line 122, as illustrated in FIG. 4. In such a case, a power line having a power voltage different from 1.17 volts or a ground line having a ground voltage may not be connected to the first provisional bridge line 122.

Figure 8:
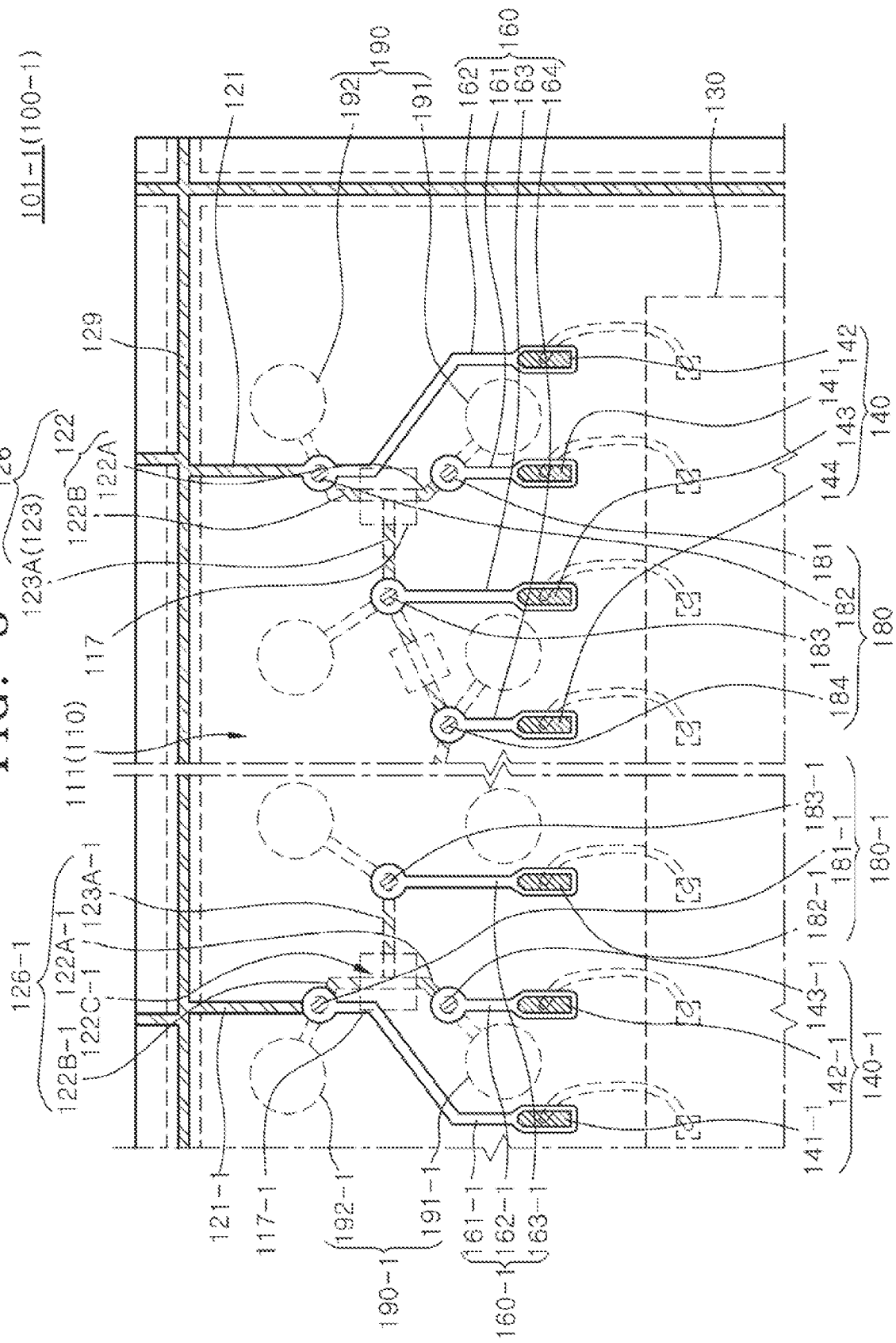
Figure 9:
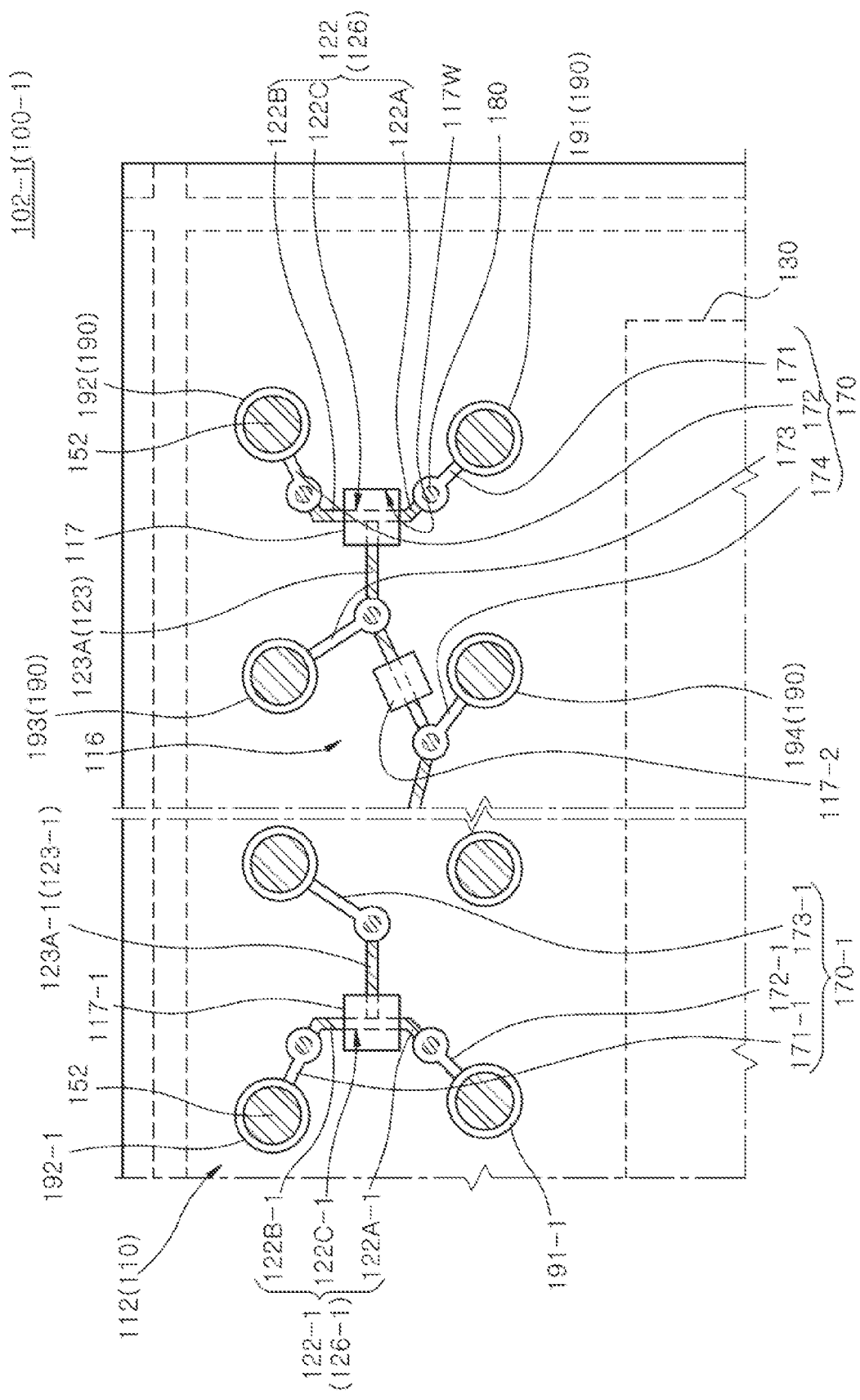

FIG. 8 is a plan view schematically illustrating a top circuit layout 101-1 of a package substrate 100-1 according to another embodiment of the present disclosure. FIG. 9 is a plan view schematically illustrating a bottom circuit layout 102-1 of the package substrate 100-1 shown in FIG. 8. In FIGS. 8 and 9, the same reference numerals as used in FIGS. 3, 4, 6 and 7 denote the same elements.

Referring to FIG. 8, the top circuit layout 101-1 of the package substrate 100-1 may have a plating line structure that includes a first plating lead line 121 and a second plating lead line 121-1 which are spaced apart from each other and includes a first group of provisional bridge lines 126 and a second group of provisional bridge lines 126-1 which are spaced apart from the first group of provisional bridge lines 126. The top circuit layout 101-1 may further include a first group of conductive lines 160 and a second group of conductive lines 160-1.

The first and second plating lead lines 121 and 121-1 may be disposed on the first surface 111 of the base layer 110 to be spaced apart from each other. The first plating lead line 121 may be connected to one of the first group of conductive lines 160, for example, a first conductive line 162. The first conductive line 162 may correspond to the second trace pattern 162 illustrated in FIG. 3. The first group of conductive lines 160 may correspond to the trace patterns 160 of the first layer illustrated in FIG. 3. The first group of conductive lines 160 may include the first trace pattern 161, the second trace pattern 162, the third trace pattern 163 and the fourth trace pattern 164.

The first group of conductive lines 160 may connect a first group of bonding fingers 140 to a first group of conductive vias 180. The first group of bonding fingers 140 may correspond to the bonding fingers 140 illustrated in FIG. 3. Accordingly, the first group of bonding fingers 140 may include the first to fourth bonding fingers 141, 142, 143 and 144. The first group of conductive vias 180 may correspond to the conductive vias 180 illustrated in FIG. 3. Accordingly, the first group of conductive vias 180 may include the first to fourth conductive vias 181, 182, 183 and 184.

The second plating lead line 121-1 may be connected to one of the second group of conductive lines 160-1, for example, a second conductive line 161-1. The second group of conductive lines 160-1 may include the second conductive line 161-1, a third conductive line 162-1 and a fourth conductive line 163-1. The second group of conductive lines 160-1 may connect a second group of bonding fingers 140-1 to a second group of conductive vias 180-1. The second group of bonding fingers 140-1 may include a fifth bonding finger 141-1, a sixth bonding finger 142-1 and a seventh bonding finger 143-1. The second group of conductive vias 180-1 may include a fifth conductive via 181-1, a sixth conductive via 182-1 and a seventh conductive via 183-1. The first and second groups of conductive lines 160 and 160-1 may be disposed on the first surface 111 of the base layer 110 to be spaced apart from each other.

Referring to FIG. 9, a third group of conductive lines 170 and a fourth group of conductive lines 170-1 may be disposed on the second surface 112 of the base layer 110. The first group of provisional bridge lines 126 may electrically connect the third group of conductive lines 170 to each other. The third group of conductive lines 170 may correspond to the trance patterns 170 of the second layer illustrated in FIG. 4. Thus, the third group of conductive lines 170 may include the fifth to eighth trace patterns 171, 172, 173 and 174. The second group of provisional bridge lines 126-1 may electrically connect the fourth group of conductive lines 170-1 to each other. The fourth group of conductive lines 170-1 may include a fifth conductive line 171-1, a sixth conductive line 172-1 and a seventh conductive line 173-1.

The second dielectric layer may be patterned to provide the first opening hole 117 and a second opening hole 117-1. The first opening hole 117 may penetrate the central portion 122C of the first provisional bridge line 122 among the first group of provisional bridge lines 126 to cut the first provisional bridge line 122 into the first and second remaining portions 122A and 122B which are separated from each other. The central portion 122C of the first provisional bridge line 122 may be removed to form the first opening holes 117. A portion of the second provisional bridge line 123 may be removed by the first opening hole 117 cutting the first provisional bridge line 122 to provide the remaining portion 123A which is separated from the first and second remaining portions 122A and 122B. A third opening hole 117-2 may be additionally provided to be spaced apart from the first opening hole 117.

The second opening hole 117-1 may penetrate a central portion 122C-1 of the one 122-1 of the second group of provisional bridge lines 126-1 to cut the provisional bridge line 122-1 into a third remaining portion 122A-1 and a fourth remaining portion 122B-1 which are separated from each other. The central portion 122C-1 of the one 122-1 of the second group of provisional bridge lines 126-1 may be removed to form the second opening holes 117-1. In addition, the second opening hole 117-1 may also cut a portion of another one 123-1 among the second group of provisional bridge lines 126-1 to provide the remaining portion 123A-1 which is separated from the third and fourth remaining portions 122A-1 and 122B-1.

The first and second remaining portions 122A and 122B may be conductive lines to which the same operation voltage having a first voltage level is applied. The operation voltage having the first voltage level may be applied to the first ball land 191 and the second ball land 192 which are respectively connected to the first and second remaining portions 122A and 122B. The first ball land 191 and the second ball land 192 may be included in a first group of ball lands 190 corresponding to the ball lands 190 illustrated in FIG. 4.

The second remaining portion 122B may be connected to a power line transmitting a power voltage, and the first remaining portion 122A may be connected to a signal line transmitting data signals, address signals or command signals.

The first remaining portion 122A may be connected to a signal line configured to transmit a data input/output (DQ) to the semiconductor chip. The second remaining portion 122B may be connected to a power line configured to supply an output stage drain power voltage (VDDQ) to the semiconductor chip.

The first remaining portion 122A may be connected to a first signal line that transmits at least one of a data signal, an address signal and a command signal to the semiconductor chip. The second remaining portion 122B may be connected to a second signal line.

The third and fourth remaining portions 122A-1 and 122B-1 may be conductive lines to which the same operation voltage having a second voltage level is applied. The operation voltage having the second voltage level may be applied to a first ball land 191-1 and a second ball land 192-1 which are respectively connected to the third and fourth remaining portions 122A-1 and 122B-1. The first ball land 191-1 and the second ball land 192-1 may be included in a second group of ball lands 190-1. The third remaining portion 122A-1 may be connected to a first ground line coupled to the semiconductor chip 130, and the fourth remaining portion 122B-1 may be connected to a second ground line coupled to the semiconductor chip 130.

An operation voltage applied to the third group of conductive lines 170 may have a voltage level which is different from a voltage level of an operation voltage applied to the fourth group of conductive lines 170-1. Accordingly, an operation voltage applied to the first and second remaining portions 122A and 122B may be different from an operation voltage applied to the third and fourth remaining portions 122A-1 and 122B-1. The second group of provisional bridge lines 126-1 may electrically connect only interconnection lines having the same voltage level to each other.

Referring again to FIG. 1, the package substrate 100F of the semiconductor package 10 may include the plating lead line 121 and the first and second remaining portions 122A and 122B of any one of the first provisional bridge line 122 of the provisional bridge lines 126.

Referring to FIGS. 1 and 7, the plating lead line 121 may be confined to be connected to only the second conductive via 182 and the second bonding finger 142. In addition, as illustrated in FIGS. 6 and 7, the provisional bridge lines 126 may be cut by forming the opening holes 117 to have an electrical open state.

Referring again to FIGS. 2 and 3, the package substrate 100 may include conductive lines of a first layer which are disposed on the first surface 111 of the base layer 110. The conductive lines of the first layer may include the trace patterns 160 of the first layer and the bonding fingers 140.

Referring to FIGS. 2 and 4, the package substrate 100 may include conductive lines of a second layer which are disposed on the second surface 112 of the base layer 110. The conductive lines of the second layer may include the trace patterns 170 of the second layer and the ball lands 190. The conductive lines of the second layer may be electrically connected to the conductive lines of the first layer through the conductive vias 180. The plating lead line 121 may be connected to the first trace pattern 161 corresponding to a first conductive line among the conductive lines of the first layer. The provisional bridge lines 126 may electrically connect the conductive lines of the second layer to each other.

A conductive line (e.g., the second trace pattern 162) connected to the plating lead line 121 may act as a portion of a power line that supplies a power voltage to the semiconductor chip 130. Alternatively, the second trace pattern 162 may act as a portion of a ground line that supplies a ground voltage to the semiconductor chip 130.

Referring to FIG. 5, the central portion 122C of the first provisional bridge line 122 may be cut to provide one of the opening holes 117. The first and second remaining portions 122A and 122B are separated from each other by one of the opening hole 117. The first remaining portion 122A may be connected to a second conductive line among the conductive lines of the second layer, and the second remaining portion 122B may be connected to a third conductive line among the conductive lines of the second layer. The second conductive line may correspond to the fifth trace pattern 171, and the third conductive line may correspond to the sixth trace pattern 172. The same operation voltage may be applied to both of the second conductive line connected to the first remaining portion 122A and the third conductive line connected to the second remaining portion 122B.

The second conductive line may act as a signal line applying data signals, address signals or command signals to the semiconductor chip 130. The third conductive line may act as a power line supplying a power voltage to the semiconductor chip 130. Alternatively, the second conductive line may act as a first ground line coupled to the semiconductor chip 130, and the third conductive line may act as a second ground line coupled to the semiconductor chip 130.

The second conductive line may be configured to transmit a data input/output (DQ) to the semiconductor chip 130. The third conductive line may be configured to supply an output stage drain power voltage (VDDQ) to the semiconductor chip 130.

The second conductive line may be configured to function as a first signal line that transmits at least one of a data signal, an address signal and a command signal to the semiconductor chip 130. The third conductive line may be configured to function as a second signal line.

Figure 10:
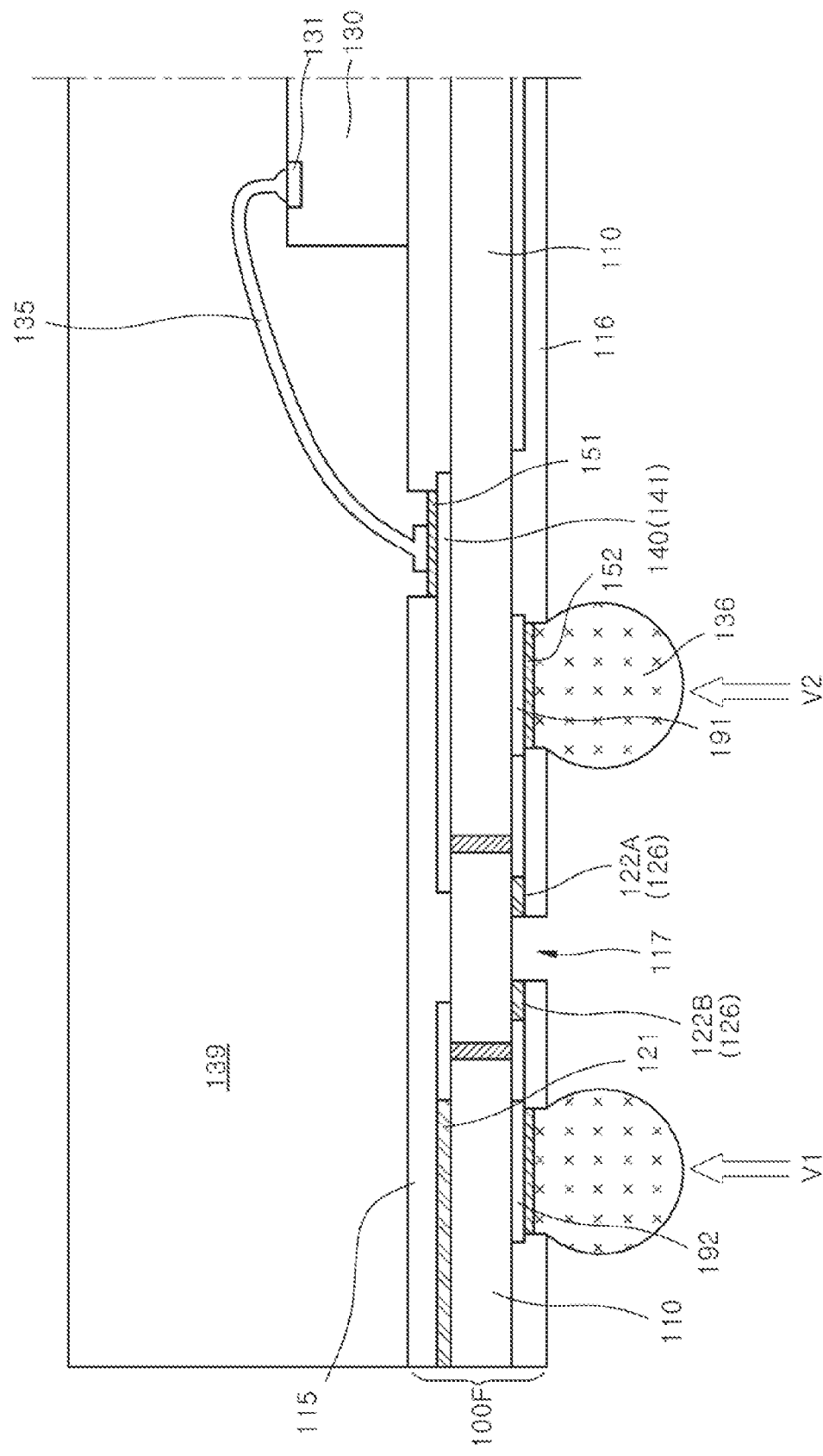
FIG. 10 is a cross-sectional view illustrating a status that voltages are applied to a semiconductor package according to an embodiment of the present disclosure.
Figure 11:
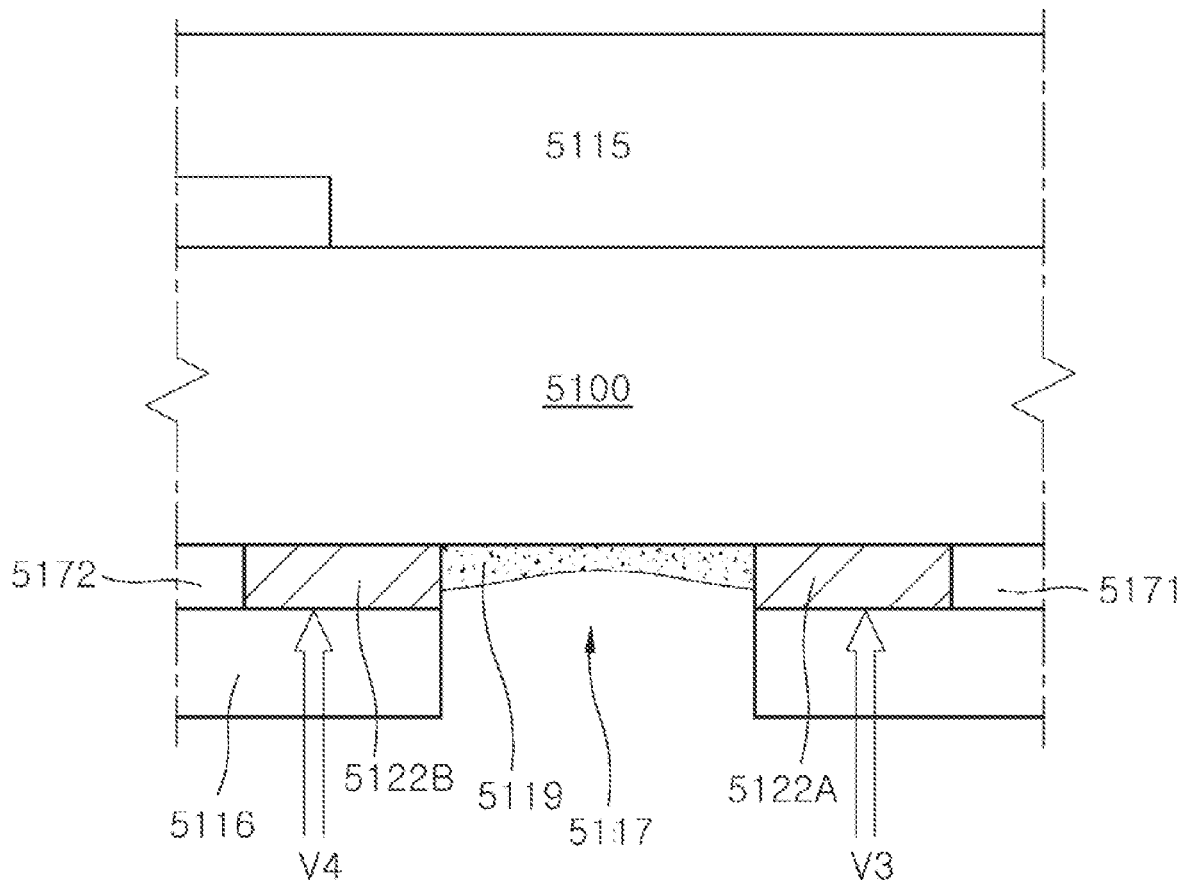
FIG. 11 is a cross-sectional view illustrating an example in which an electro-chemical migration (ECM) phenomenon occurs in a semiconductor package.

FIG. 10 is a cross-sectional view illustrating the semiconductor package 10 to which operation voltages V1 and V2 are applied. FIG. 11 is a cross-sectional view illustrating an electro-chemical migration (ECM) phenomenon that occurs in a package substrate 10R of a semiconductor package according to a comparative example.

Referring to FIG. 10, a reliability test may be performed with the semiconductor package 10. For example, a highly accelerated stress test (HAST) may be performed as the reliability test. The reliability of the semiconductor package 10 may be tested by applying biases to the semiconductor package 10 at a high temperature and in high humidity. The biases applied to the semiconductor package 10 may be voltage biases having substantially the same levels as operation voltages of the semiconductor package 10. For example, a first voltage V1 may be applied to the second ball land 192 of the semiconductor package 10, and a second voltage V2 may be applied to the first ball land 191 of the semiconductor package 10. The first voltage V1 may be approximately 1.17 volt, and the second voltage V2 may be approximately 1.17 volt.

The second ball land 192, the second conductive via 182 and the second bonding finger 142 may constitute a power line configured to supply a power voltage to the semiconductor chip. The first ball land 191, the first conductive via 181 and the first bonding finger 141 may constitute a signal line configured to transmit at least one of a data signal, an address signal and a command signal to the semiconductor chip.

The second ball land 192, the second conductive via 182 and the second bonding finger 142 may constitute a signal line configured to transmit a data input/output (DQ) to the semiconductor chip. The first ball land 191, the first conductive via 181 and the first bonding finger 141 may constitute a power line configured to supply an output stage drain power voltage (VDDQ) to the semiconductor chip.

The first ball land 191, the first conductive via 181 and the first bonding finger 141 may constitute a first ground line configured to supply a ground voltage to the semiconductor chip. The second ball land 192, the second conductive via 182 and the second bonding finger 142 may constitute a second ground line configured to supply another ground voltage to the semiconductor chip.

The first ball land 191, the first conductive via 181 and the first bonding finger 141 may constitute a first signal line configured to transmit a first data input/output (DQ) to the semiconductor chip. The second ball land 192, the second conductive via 182 and the second bonding finger 142 may constitute a second signal line configured to transmit a second data input/output (DQ) to the semiconductor chip.

The first ball land 191, the first conductive via 181 and the first bonding finger 141 may constitute a power line configured to supply a drain power voltage (VDD) to the semiconductor chip. The second ball land 192, the second conductive via 182 and the second bonding finger 142 may constitute a signal line configured to transmit column address (CA) to the semiconductor chip.

Since the side surfaces of the first and second remaining portions 122A and 122B are exposed at sidewalls of the opening hole 117, the HAST may be performed while the side surfaces of the first and second remaining portions 122A and 122B are exposed to a test environment. In such a case, the same voltage, for example, a voltage of 1.17 volts may be applied to both of the first and second remaining portions 122A and 122B. That is, a voltage difference between the first and second remaining portions 122A and 122B may be theoretically zero. Accordingly, no ECM phenomenon may occur in a region between the first and second remaining portions 122A and 122B.

Referring to FIG. 11, the package substrate 10R of the comparative example may include a base layer 5100 and first and second dielectric layers 5115 and 5116 respectively disposed on a top surface and a bottom surface of the base layer 5100. An opening hole 5117 may be formed in the second dielectric layer 5116. A provisional bridge line may be cut to provide the opening hole 5117. A first remaining portion 5122A and a second remaining portion 5122B are spaced apart from each other by the opening hole 5117. Thus, side surfaces of the first and second remaining portions 5122A and 5122B may be exposed by the opening hole 5117. When a third voltage V3 is applied to the first remaining portion 5122A and a fourth voltage V4 different from the third voltage V3 is applied to the second remaining portion 5122B, a voltage difference between the first and second remaining portions 5122A and 5122B may be occurred. In such a case, the ECM phenomenon may occur in a region between the first and second remaining portions 5122A and 5122B. The ECM phenomenon may cause migration and precipitation of metal ions between the first and second remaining portions 5122A and 5122B to generate an abnormal conductive layer 5119 between the first and second remaining portions 5122A and 5122B. The abnormal conductive layer 5119 may cause an electrical shortage failure between the first and second remaining portions 5122A and 5122B. That is, the abnormal conductive layer 5119 may electrically connect a first conductive line 5171 coupled to the first remaining portion 5122A to a second conductive line 5172 coupled to the second remaining portion 5122B.

Referring again to FIG. 10, since the same voltage is applied to both of the first and second remaining portions 122A and 122B, the ECM phenomenon between the first and second remaining portions 122A and 122B may be suppressed while the HAST of the semiconductor package 10 is performed. Accordingly, the reliability of the semiconductor package 10 may be improved.

Figure 12:
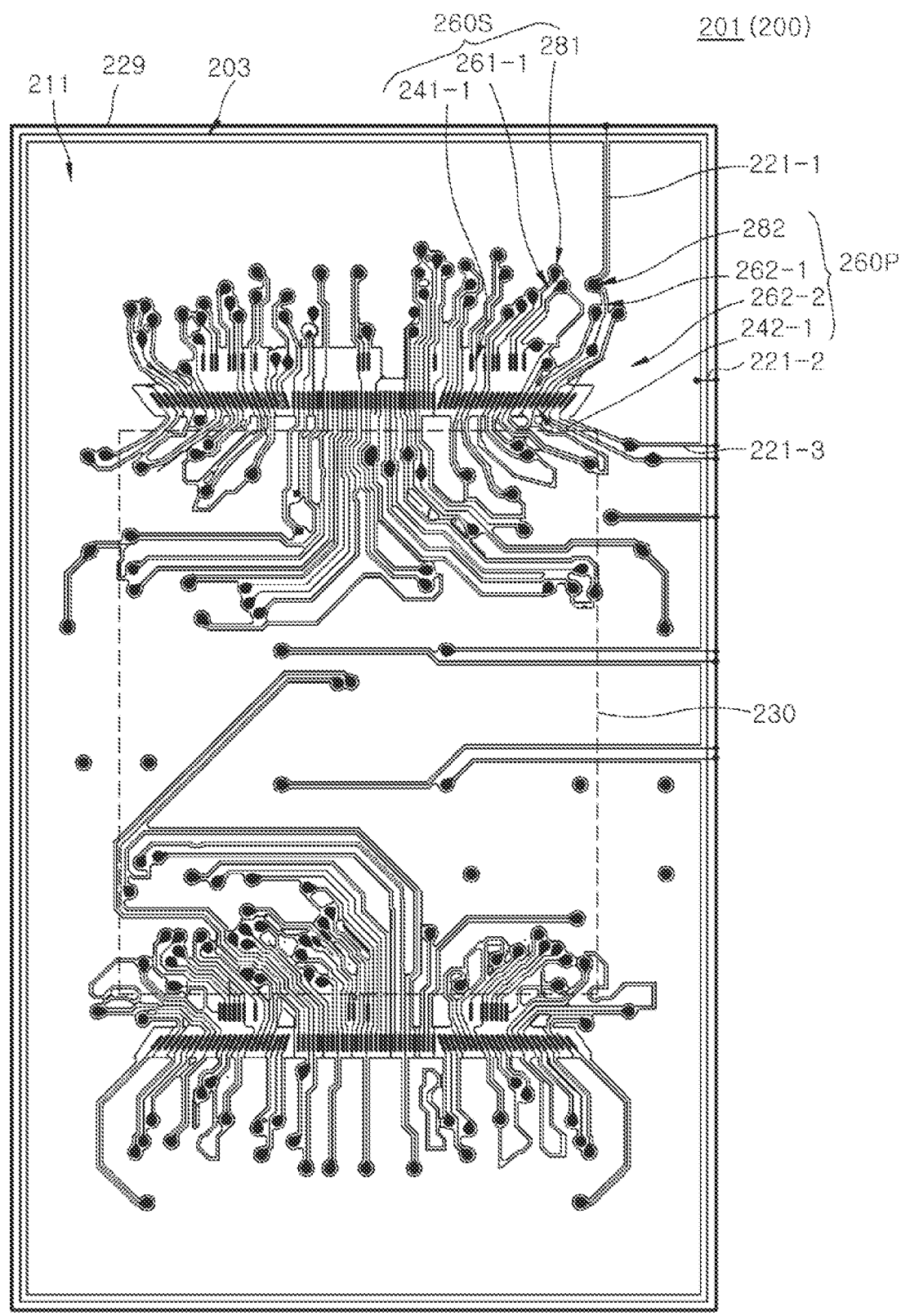
FIG. 12 is a plan view illustrating a top circuit layout of a package substrate included in a semiconductor package according to an embodiment of the present disclosure.
Figure 13:
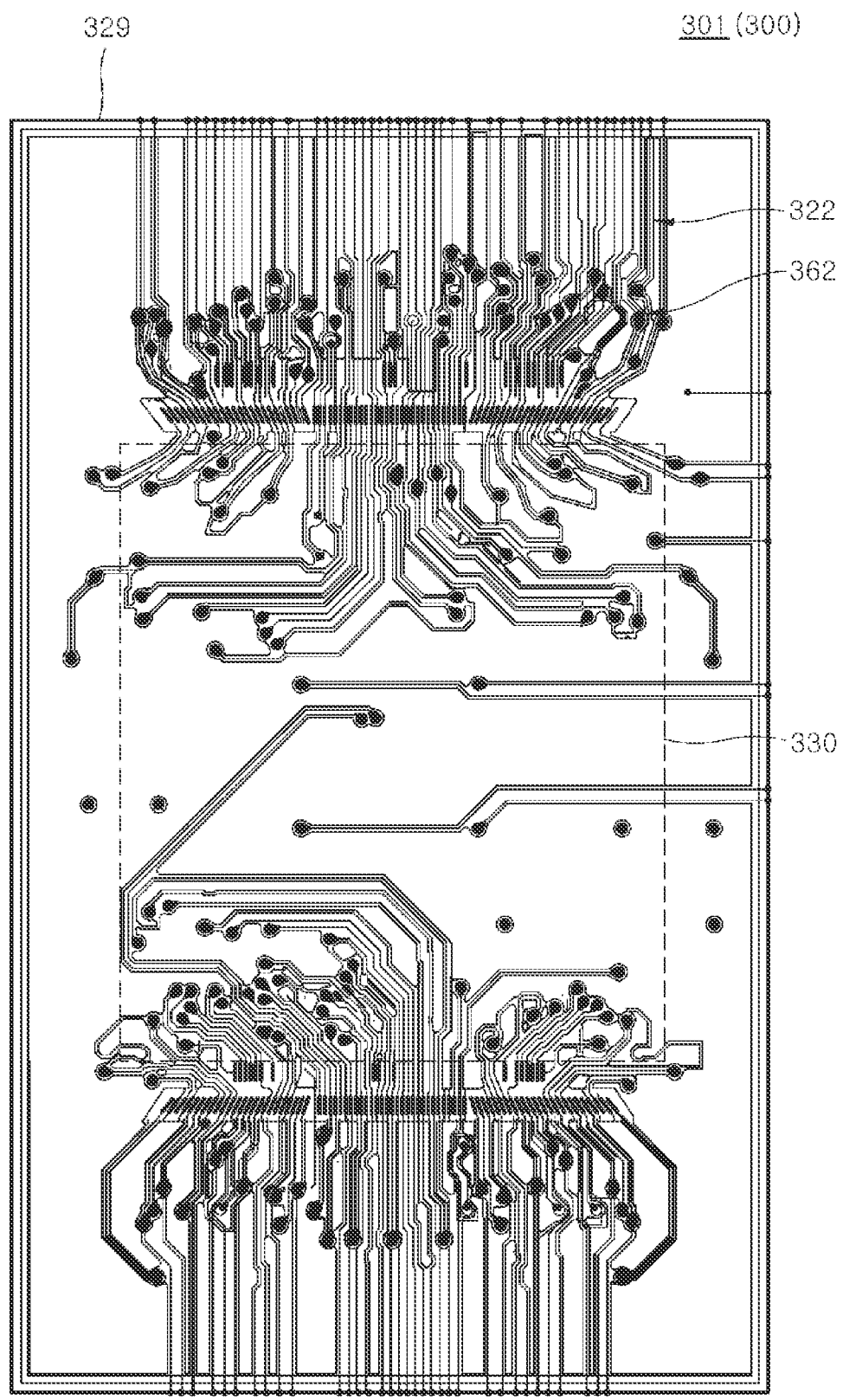
FIG. 13 is a plan view illustrating a top circuit layout of a package substrate included in a semiconductor package according to a comparative example.

FIG. 12 is a plan view illustrating a top circuit layout 201 of a package substrate 200 included in a semiconductor package according to an embodiment of the present disclosure. FIG. 13 is a plan view illustrating a top circuit layout 301 of a package substrate 300 included in a semiconductor package according to a comparative example.

The top circuit layout 201 of the package substrate 200 illustrated in FIG. 12 illustrates interconnection lines disposed on an inner region 203 of the package substrate 200. Plating lead lines 221-1, 221-2 and 221-3 may be designed not to be directly connected to first conductive lines 260S on a first surface 211 of a base layer of the package substrate 200. The first conductive lines 260S may include signal lines that transmit data signals or command/address signals to a semiconductor chip 230 mounted on the package substrate 200. The first conductive lines 260S may include a first trace pattern 261-1, a first bonding finger 241-1 and a first conductive via 281.

Each of the plating lead lines 221-1, 221-2 and 221-3 may be disposed to be connected to a non-signal line such as a power line or a ground plane. For example, a first plating lead line 221-1 of the plating lead lines 221-1, 221-2 and 221-3 may be branched from a plating bus 229 and may be connected to second conductive lines 260P. The second conductive lines 260P may include a second trace pattern 262-1, a second bonding finger 242-1 and a second conductive via 282. The second conductive lines 260P may constitute a first power line for supplying a power voltage to the semiconductor chip 230. A second plating lead line 221-2 of the plating lead lines 221-1, 221-2 and 221-3 may be disposed to connect the plating bus 229 to a ground plane 262-2. A third plating lead line 221-3 of the plating lead lines 221-1, 221-2 and 221-3 may be disposed to connect a second power line to the plating bus 229.

The first to third plating lead lines 221-1, 221-2 and 221-3 may be disposed to be connected only to the power lines and the ground plane on the first surface 211 of the base layer of the package substrate 200. In contrast, the top circuit layout 301 of the package substrate 300 illustrated in FIG. 13 includes a lot of plating lead lines 322 branched from a plating bus 329. In the top circuit layout 301, the plating lead lines 322 may be connected to signal lines 362, which are electrically connected to a semiconductor chip 330 mounted on the package substrate 300, respectively. As such, the number of the plating lead lines 322 may be much greater than the number of the plating lead lines 221-1, 221-2 and 221-3.

The plating lead lines 322 respectively connected to the signal lines 362 may act as stubs corresponding to undesirable transmission lines while the semiconductor package operates. Thus, when signals are inputted to or outputted from the semiconductor chip 330, the plating lead lines 322 may cause undesirable reflection of signals to degrade a signal integrity of the semiconductor package.

As can be seen from FIGS. 12 and 13, the number of the plating lead lines 221-1, 221-2 and 221-3 is much less than the number of plating lead lines 322. That is, a total length of the plating lead lines 221-1, 221-2 and 221-3 included in the package substrate 200 may be significantly reduced as compared with a total length of the plating lead lines 322 included in the package substrate 300. Moreover, the plating lead lines 221-1, 221-2 and 221-3 of FIG. 12 may not be electrically connected to the signal lines 260S. Thus, it may be possible to prevent the plating lead lines 221-1, 221-2 and 221-3 from acting as stubs.

According to the embodiments, the number of plating lead lines disposed in a semiconductor package may be remarkably reduced. That is, the number of the plating lead lines disposed on a package substrate of the semiconductor package may be reduced. This may lead to reduction of a total length of the plating lead lines. Accordingly, it may be possible to suppress that the plating lead lines degrade an operation characteristic or a signal integrity of the semiconductor package. The package substrate of the semiconductor package may be configured to prevent or suppress an ECM phenomenon.

Figure 14:
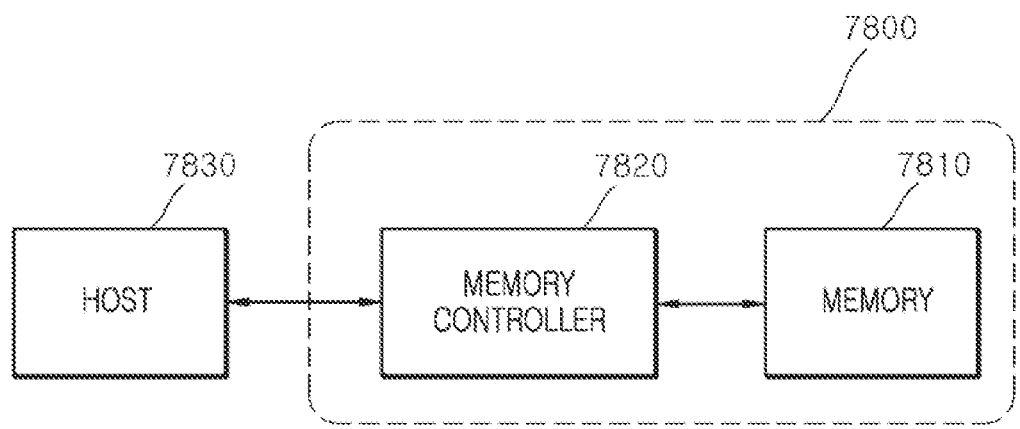
FIG. 14 is a block diagram illustrating an electronic system employing a memory card including a semiconductor package according to an embodiment.

FIG. 14 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 15:
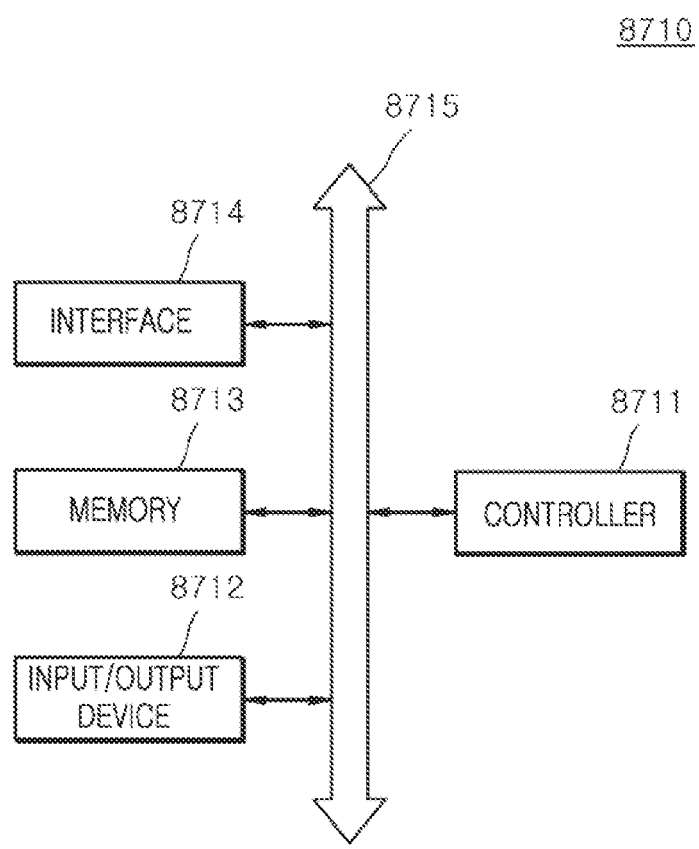
FIG. 15 is a block diagram illustrating another electronic system including a semiconductor package according to an embodiment.

FIG. 15 is a block diagram illustrating an electronic system 8710 including at least one of the semiconductor packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
    a semiconductor chip; and
    a package substrate on which the semiconductor chip is mounted,
    wherein the package substrate includes:
    a base layer having a first surface and a second surface which are opposite to each other;
    a first bonding finger disposed on the first surface of the base layer;
    a plating lead line disposed on the first surface of the base layer to be spaced apart from the first bonding finger;
    a first conductive via disposed to substantially penetrate the base layer and electrically connected to the first bonding finger;
    a second conductive via disposed to substantially penetrate the base layer and electrically connected to the plating lead line;
    a first ball land and a second ball land disposed on the second surface of the base layer and respectively connected to the first and second conductive vias;
    a first remaining portion electrically connected to the first conductive via;
    a second remaining portion electrically connected to the second conductive via; and an opening hole coupled between the first remaining portion and the second remaining portion to space apart the first remaining portion from the second remaining portion, wherein the first ball land is electrically coupled to the first remaining portion and the second ball land is electrically coupled to the second remaining portion, and wherein both the first and second ball lands are coupled to substantially the same operation voltages.

2. The semiconductor package of claim 1, further comprising:
a first plating layer formed on the first bonding finger; and
a second plating layer formed on the first and second ball lands.

3. The semiconductor package of claim 1, wherein the second conductive via is electrically separated from the first conductive via and the plating lead line is electrically separated from the first bonding finger by the opening hole.

4. The semiconductor package of claim 1, further comprising a second bonding finger disposed on the first surface of the base layer to be spaced apart from the first bonding finger and electrically connected to the plating lead line.

5. The semiconductor package of claim 4,
wherein the second ball land, the second conductive via and the second bonding finger constitute a power line configured to supply a power voltage to the semiconductor chip; and
wherein the first ball land, the first conductive via and the first bonding finger constitute a signal line configured to transmit at least one of a data signal, an address signal and a command signal to the semiconductor chip.

6. The semiconductor package of claim 4,
wherein the second ball land, the second conductive via and the second bonding finger constitute a signal line configured to transmit a data input/output (DQ) to the semiconductor chip; and
wherein the first ball land, the first conductive via and the first bonding finger constitute a power line configured to supply an output stage drain power voltage (VDDQ) to the semiconductor chip.

7. The semiconductor package of claim 4,
wherein the first ball land, the first conductive via and the first bonding finger constitute a first ground line configured to supply a ground voltage to the semiconductor chip; and
wherein the second ball land, the second conductive via and the second bonding finger constitute a second ground line configured to supply another ground voltage to the semiconductor chip.

8. The semiconductor package of claim 4,
wherein the second ball land, the second conductive via and the second bonding finger constitute a first signal line configured to transmit a first data input/output (DQ) to the semiconductor chip; and
wherein the second ball land, the second conductive via and the second bonding finger constitute a second signal line configured to transmit a second data input/output (DQ) to the semiconductor chip.

9. The semiconductor package of claim 4, further comprising:
a first trace pattern disposed on the first surface of the base layer to connect the first bonding finger to the first conductive via; and
a second trace pattern spaced apart from the first trace pattern and connects the second bonding finger to the second conductive via.

10. The semiconductor package of claim 9, further comprising:
a third bonding finger and a fourth bonding finger disposed on the first surface of the base layer to be spaced apart from the first and second bonding fingers and each other;
a third conductive via and a fourth conductive via spaced apart from the first and second conductive vias;
a third trace pattern connecting the third bonding finger to the third conductive via; and
a fourth trace pattern connecting the fourth bonding finger to the fourth conductive via.

11. The semiconductor package of claim 10, further comprising a third remaining portion coupled between the third conductive via and the opening hole,
wherein the opening hole spaces apart the first and second remaining portions from the third remaining portion.

* * * * *